(12) United States Patent  
Lee et al.

(10) Patent No.: US 10,915,210 B2  
(45) Date of Patent: Feb. 9, 2021

(54) TOUCH DISPLAY PANEL AND TOUCH DISPLAY DEVICE

(71) Applicant: LG Display Co., Ltd., Seoul (KR)

(72) Inventors: HwiDeuk Lee, Gyeongsangbuk-do (KR); Yangsik Lee, Gyeonggi-do (KR); Jaeseung Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/525,488

(22) Filed: Jul. 29, 2019

(65) Prior Publication Data

US 2020/0167037 A1 May 28, 2020

(30) Foreign Application Priority Data

Nov. 23, 2018 (KR) .......................... 10-2018-0146393

(51) Int. Cl.
 G06F 3/044 (2006.01)
 G06F 3/041 (2006.01)
 (Continued)

(52) U.S. Cl.
 CPC .......... G06F 3/0445 (2019.05); G06F 3/0412 (2013.01); G06F 3/0446 (2019.05);
 (Continued)

(58) Field of Classification Search
 CPC combination set(s) only.
 See application file for complete search history.

(56) References Cited

U.S. PATENT DOCUMENTS

2014/0070875 A1* 3/2014 Dunphy ................ G06F 3/0446  
 327/517  
2014/0285728 A1 9/2014 Lee  
 (Continued)

FOREIGN PATENT DOCUMENTS

EP 3293765 A1 3/2018  
EP 3410276 A1 12/2018

OTHER PUBLICATIONS

European Search Report dated Apr. 22, 2020 issued in corresponding European Application No. 19199930.9 (11 pages).

*Primary Examiner* — William Boddie  
*Assistant Examiner* — Alecia D English  
(74) *Attorney, Agent, or Firm* — Polsinelli PC

(57) ABSTRACT

Example embodiments of the present disclosure relate to a touch display device. In one example, a touch display device includes a substrate including an active area in which multiple subpixels are arranged and a nonactive area positioned outside the active area; wherein each of the multiple subpixels includes a first electrode, an organic light emitting layer and a second electrode on the organic light emitting layer; an encapsulation layer arranged on the second electrode; a plurality of touch electrodes and a plurality of touch routing wires arranged on the encapsulation layer; a touch sensing circuit configured to drive the plurality of touch electrodes through the plurality of touch routing wires; multiple connection patterns arranged on the encapsulation layer in the active area so as to electrically connect at least a portion of the plurality of touch electrodes to each other; multiple first compensation patterns arranged in the nonactive area and electrically connected to the plurality of touch routing wires; and multiple second compensation patterns arranged on the encapsulation layer corresponding to the multiple first compensation patterns.

24 Claims, 27 Drawing Sheets

(51) Int. Cl.
    *H01L 27/32*    (2006.01)
    *H01L 51/52*    (2006.01)

(52) U.S. Cl.
    CPC ........ *H01L 27/323* (2013.01); *H01L 51/5253* (2013.01); *G06F 2203/04112* (2013.01); *H01L 27/3244* (2013.01)

(56) References Cited

U.S. PATENT DOCUMENTS

2017/0131842 A1\* 5/2017 Hashiguchi ........... G06F 3/0412
2018/0011385 A1   1/2018 Kang et al.
2019/0103443 A1\* 4/2019 Kim ................... H01L 51/5253

\* cited by examiner (Unit : pF)

| Distinction | | (n-1)th X-TEL | nth X-TEL | Noise Source |
|---|---|---|---|---|
| Cp | TE | 500 | 500 | E2 |
| | CPTN | 60 | 70 | GND |
| | TL | 20 | 10 | E2 |
| | Total | 580 | 580 | - |

FIG.17

(Unit : pF)

| Distinction | | (n−1)th X-TEL | nth X-TEL | Noise Source |
|---|---|---|---|---|
| Cp | TE | 500 | 500 | E2 |
| | CPTN | 60 | 70 | E2 |
| | TL | 20 | 10 | E2 |
| | Total | 580 | 580 | − |

TOUCH DISPLAY PANEL AND TOUCH DISPLAY DEVICE

CROSS-REFERENCE TO RELATED APPLICATION

This application claims priority from Korean Patent Application No. 10-2018-0146393, filed on Nov. 23, 2018, which is hereby incorporated by reference in its entirety.

BACKGROUND

Field of Disclosure

Example embodiments of the present disclosure relate to a touch display panel and a touch display device.

Description of the Background

There have been increasing demands for display devices that display images in line with development of information-oriented societies, and various kinds of display devices have been utilized, such as a liquid crystal display device and an organic light-emitting display device.

In order to provide more diversified functions, such a display device provides functions of recognizing a user's finger touch or pen touch with regard to a display panel and performing input processing on the basis of the recognized touch.

For example, a display device capable of touch recognition includes multiple touch electrodes arranged on or embedded in the display panel, and can detect whether or not the user touches the display panel, the touch coordinate, and the like by driving the touch electrodes.

On the display panel that provides a touch recognition function, electrodes, signal lines, and the like are arranged, to which various voltages, signals, and the like for display driving are applied, thereby posing a problem in that the performance of touch sensing may be degraded by a parasitic capacitance formed between a display electrode and a touch electrode.

SUMMARY

An aspect of example embodiments of the present disclosure is to provide a touch display panel and a touch display device capable of reducing the deviation of touch sensing signals by compensating for the load on a wire connected to a touch electrode arranged on a display panel.

Another aspect of example embodiments of the present disclosure is to provide a touch display panel and a touch display device capable of preventing degradation of the accuracy of touch sensing signals due to a noise source related to a touch sensor metal arranged on a display panel.

Another aspect of example embodiments of the present disclosure is to provide a touch display panel and a touch display device capable of reducing noise resulting from a parasitic capacitance between a touch electrode arranged on a display panel and an electrode for display driving.

In one aspect, a touch display device a substrate including an active area in which multiple subpixels are arranged and a nonactive area positioned outside the active area; wherein each of the multiple subpixels includes a first electrode, an organic light emitting layer and a second electrode on the organic light emitting layer; an encapsulation layer arranged on the second electrode; a plurality of touch electrodes and a plurality of touch routing wires arranged on the encapsulation layer; a touch sensing circuit configured to drive the plurality of touch electrodes through the plurality of touch routing wires; multiple connection patterns arranged on the encapsulation layer in the active area so as to electrically connect at least a portion of the plurality of touch electrodes to each other; multiple first compensation patterns arranged in the nonactive area and electrically connected to the plurality of touch routing wires; and multiple second compensation patterns arranged on the encapsulation layer corresponding to the multiple first compensation patterns.

In another aspect, a ground voltage is applied to the multiple second compensation patterns.

In another aspect, a same voltage is applied to the second electrode and the multiple second compensation patterns.

In another aspect, the multiple second compensation patterns are electrically connected to the second electrode via at least one hole provided in the encapsulation layer.

In another aspect, the multiple second compensation patterns are arranged on a same layer as the multiple connection patterns.

In another aspect, the touch display device further includes at least one touch insulating film between the multiple connection patterns and the plurality of touch electrodes.

In another aspect, the at least one touch insulating film includes a first touch insulating film between the multiple connection patterns and the multiple second compensation patterns; and a second touch insulating film between the multiple second compensation patterns and the multiple first compensation patterns.

In another aspect, an area of each of the multiple first compensation patterns, on each side of the substrate, is inversely proportional to a length of a corresponding one of the plurality of touch routing wires.

In another aspect, at least one of the plurality of touch routing wires has a first part arranged in a first area closer to the touch sensing circuit and a second part arranged in a second area further from the touch sensing circuit, a width of the first part being smaller than a width of the second part.

In another aspect, the touch sensing circuit is configured to detect a touch based on a signal corresponding to a difference between a first touch sensing signal received through a first touch routing wire and a second touch sensing signal received through a second touch routing wire from among the plurality of touch routing wires.

In another aspect, the plurality of touch routing wires are arranged along a sloped surface of the encapsulation layer and are connected to a touch pad portion.

In another aspect, the touch display device further includes a dam arranged on the nonactive area, wherein the plurality of touch routing wires cross over the dam.

In another aspect, the touch display device further includes at least one noise reduction electrode arranged on same layer as the first electrode, wherein the at least one noise reduction electrode is spaced apart from the first electrode.

In another aspect, a same voltage is applied to the at least one noise reduction electrode and the second electrode.

In another aspect, the at least one noise reduction electrode extends from the active area to the nonactive area in the same layer as the first electrode.

In another aspect, the at least one noise reduction electrode is electrically connected to the second electrode.

In one aspect, a touch display panel includes a substrate including an active area in which multiple subpixels are arranged and a nonactive area, each of the multiple subpixels including a first electrode, an organic light emitting layer and a second electrode on the organic light emitting layer; an encapsulation layer arranged on the second electrode; a plurality of touch electrodes and a plurality of touch routing wires arranged on the encapsulation layer; and multiple compensation patterns configured to equalize first capacitance and second capacitance, the first capacitance being formed between the plurality of touch electrodes and the second electrode in the active area, the second capacitance being formed between the plurality of touch routing wires and the second electrode in the nonactive area.

In another aspect, a same voltage is applied to the second electrode and the multiple compensation patterns to equalize the first capacitance and the second capacitance.

In another aspect, the touch display device further includes at least one noise reduction electrode arranged on same layer as the first electrode, wherein the at least one noise reduction electrode is spaced apart from the first electrode and is configured to reduce noise associated with the second electrode in the active area.

In another aspect, a same voltage is applied to the at least one noise reduction electrode and the second electrode.

In another aspect, the at least one noise reduction electrode extends from the active area to the nonactive area in the same layer as the first electrode.

In another aspect, the at least one noise reduction electrode is electrically connected to the second electrode.

In another aspect, an area of each of the multiple compensation patterns, on each side of the substrate, is inversely proportional to a length of a corresponding one of the plurality of touch routing wires.

In another aspect, the plurality of touch routing wires are arranged along a sloped surface of the encapsulation layer and are connected to a touch pad portion.

BRIEF DESCRIPTION OF THE DRAWINGS

The above and other aspects, features and advantages of the present disclosure will be more apparent from the following detailed description taken in conjunction with the accompanying drawings, in which:

FIG. 17 illustrates an exemplary noise source of touch sensing signals detected through a touch sensor metal in the structure illustrated in FIG. 15 and FIG. 16 according to example embodiments of the present disclosure;

DETAILED DESCRIPTION

Figure 1:
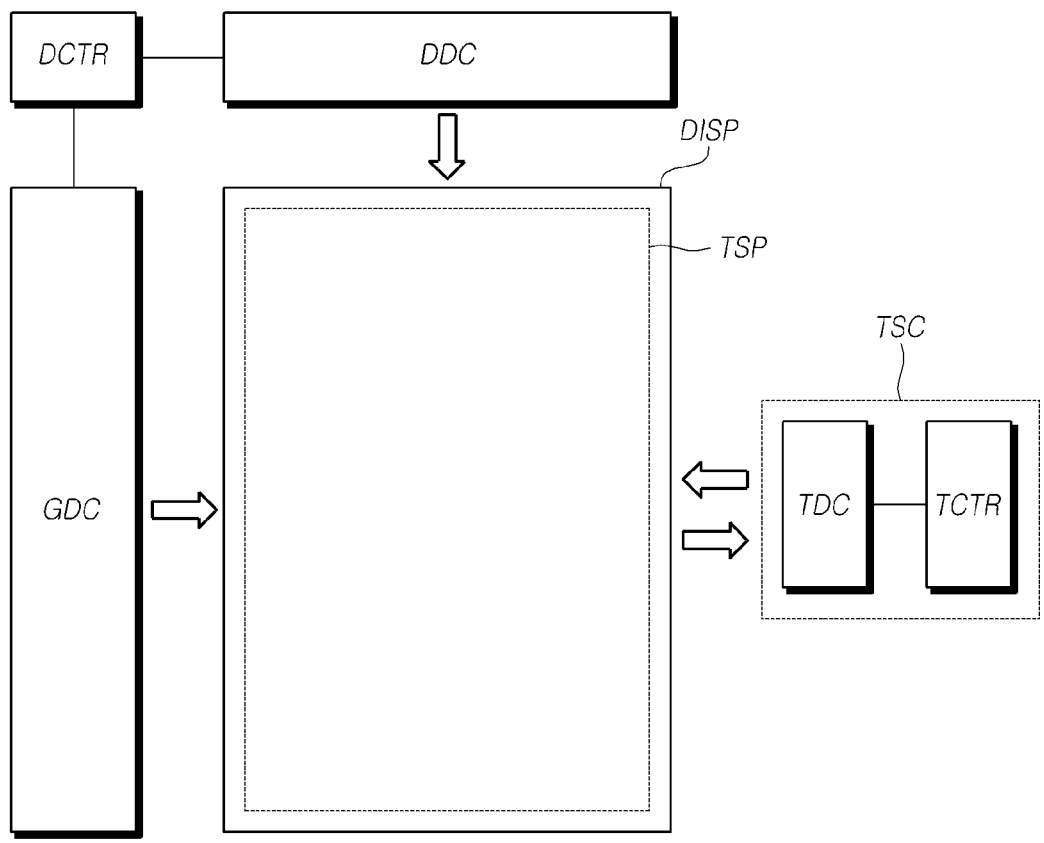
FIG. 1 illustrates a schematic configuration of a touch display device according to example embodiments of the present disclosure.

Hereinafter, some example embodiments of the present disclosure will be described in detail with reference to the accompanying illustrative drawings. While specific implementations are discussed, it should be understood that this is done for illustration purposes only. A person skilled in the relevant art will recognize that other components and configurations may be used without parting from the spirit and scope of the disclosure.

In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

Reference to "one example" or "an example" means that a particular feature, structure, or characteristic described in connection with the example is included in at least one example of the disclosure. The appearances of the phrase "in one example" in various places in the specification are not necessarily all referring to the same example, nor are separate or alternative example mutually exclusive of other examples. Moreover, various features are described which may be exhibited by some examples and not by others. Similarly, various requirements are described which may be requirements for some examples but not other examples.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various examples given in this specification.

Without intent to limit the scope of the disclosure, examples of instruments, apparatus, methods and their related results according to the examples of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

In addition, terms, such as first, second, A, B, (a), (b) or the like may be used herein when describing components of the present disclosure. These terms are merely used to distinguish one component from other components, and the property, order, sequence and the like of the corresponding component are not limited by the corresponding term. For example, a first element could be termed a second element, and similarly, a second element could be termed a first element, without departing from the scope of this disclosure. As used herein, the term "and/or," includes any and all combinations of one or more of the associated listed items. In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

In the same context, it will be understood that when an element is referred to as being formed "on" or "under" another element, not only can it be directly formed on or under another element, but it can also be indirectly formed on or under another element via an intervening element. By contrast, when an element is referred to as being "directly on," or "directly under," to another element, there are no intervening elements present.

The terminology used herein is for the purpose of describing particular examples only and is not intended to be limiting. As used herein, the singular forms "a", "an", and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of examples. However, it will be understood by one of ordinary skill in the art that examples may be practiced without these specific details. For example, systems may be shown in block diagrams so as not to obscure the examples in unnecessary detail. In other instances, well-known processes, structures and techniques may be shown without unnecessary detail in order to avoid obscuring example examples.

In the following description, illustrative examples will be described with reference to acts and symbolic representations of operations (e.g., in the form of flow charts, flow diagrams, data flow diagrams, structure diagrams, block diagrams, etc.) that may be implemented as program services or functional processes include routines, programs, objects, components, data structures, etc., that perform particular tasks or implement particular abstract data types and may be implemented using hardware at network elements. Non-limiting examples of such hardware may include one or more Central Processing Units (CPUs), digital signal processors (DSPs), application-specific-integrated-circuits, field programmable gate arrays (FPGAs), computers or the like.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

For clarity of explanation, in some instances the present technology may be presented as including individual functional blocks including functional blocks comprising devices, device components, steps or routines in a method embodied in software, or combinations of hardware and software.

In some examples, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

FIG. 1 illustrates a system configuration of a touch display device according to example embodiments of the present disclosure.

Referring to FIG. 1, the touch display device according to example embodiments of the present disclosure may provide both a function for image display and a function for touch sensing.

In order to provide the image display function, the touch display device according to example embodiments of the present disclosure may include: a display panel DISP having multiple data lines and multiple gate lines arranged thereon and having subpixels arranged thereon, the subpixels being defined by the multiple data lines and the multiple gate lines; a data driving circuit DDC configured to drive the multiple data lines; a gate driving circuit GDC configured to drive the multiple gate lines; a display controller DCTR configured to control operations of the data driving circuit DDC and the gate driving circuit GDC; and the like.

Each of the data driving circuit DDC, the gate driving circuit GDC, and the display controller DCTR may be implemented as at least one individual component (e.g., a separate processor configured to execute computer-readable instructions stored in one or more associated memories to implement functionalities of DDC, GDC or DCTR). If necessary, at least two among the data driving circuit DDC, the gate driving circuit GDC, and the display controller DCTR may be integrated and implemented as a single component (e.g., a single processor configured to execute computer-readable instructions stored in one or more associated memories to implement functionalities of DDC, GDC and/or DCTR). For example, the data driving circuit DDC and the display controller DCTR may be implemented as a single IC chip.

In order to provide the touch sensing function, the touch display device according to example embodiments of the present disclosure may include: a touch panel TSP including multiple touch electrodes; and a touch sensing circuit TSC configured to supply a touch driving signal to the touch panel TSP, to detect a touch sensing signal from the touch panel TSP, and to sense whether or not a user's touch exists on the touch panel TSP or the touch position (touch coordinate) on the basis of the detected touch sensing signal.

The touch sensing circuit TSC may include, for example: a touch driving circuit TDC configured to supply a touch driving signal to the touch panel TSP and to detect a touch sensing signal from the touch panel TSP; a touch controller TCTR configured to sense whether or not the user's touch exists on the touch panel TSP and/or the touch position on the basis of the touch sensing signal detected by the touch driving circuit TDC.

The touch driving circuit TDC may include a first circuit part configured to supply a touch driving signal to the touch panel TSP and a second circuit part configured to detect a touch sensing signal from the touch panel TSP.

The touch driving circuit TDC and the touch controller TCTR may be implemented as separate components or, if necessary, may be integrated and implemented as a single component (e.g., a separate processor or a combined processor configured to execute computer-readable instructions stored in one or more associated memories to implement functionalities of TDC and/or TCTR).

Each of the data driving circuit DDC, the gate driving circuit GDC, and the touch driving circuit TDC may be implemented as at least one IC and, from the viewpoint of electric connection with the display panel DISP, may be implemented in a chip-on-glass (COG) type, a chip-on-film (COF) type, a tape carrier package (TCP) type, or the like. The gate driving circuit GDC may also be implemented in a gate-in-panel (GIP) type.

Each of the circuit features for display driving DDC, GDC, and DCTR and the circuit features for touch sensing TDC and TCTR may be implemented as at least one individual component. If necessary, at least one of the circuit features for display driving DDC, GDC, and DCTR and at least one of the circuit features for touch sensing TDC and TCTR may be functionally integrated and implemented as at least one component.

For example, the data driving circuit DDC and the touch driving circuit TDC may be integrated and implemented as one IC or at least two ICs. When the data driving circuit DDC and the touch driving circuit TDC are integrated and implemented into at least two ICs, each of the at least two ICs may have a data driving function and a touch driving function.

The touch display device according to example embodiments of the present disclosure may be of various types, such as an organic light-emitting display device and a liquid crystal display device. It will be assumed in the following for convenience of description that the touch display device is an organic light-emitting display device. That is, although the display panel DISP may be of various types such as an organic light-emitting display panel and a liquid crystal display panel, it will be assumed in the following for convenience of description that the display panel DISP is an organic light-emitting display panel.

As will be described later, the touch panel TSP may include: multiple touch electrodes, to which a touch driving signal may be applied, or which may detect a touch sensing signal; multiple touch routing wires for connecting the multiple touch electrodes and the touch driving circuit TDC; and the like.

The touch panel TSP may also exist outside the display panel DISP. That is, the touch panel TSP and the display panel DISP may be separately fabricated and coupled. Such a touch panel TSP will be referred to as an external type or an add-on type.

Alternatively, the touch panel TSP may be embedded in the display panel DISP. That is, when the display panel DISP is fabricated, the touch sensor structures, such as the multiple touch electrodes and the multiple touch routing wires that constitute the touch panel TSP, may be formed together with electrodes for display driving and signal lines. Such a touch panel TSP will be referred to as an embedded type. It will be assumed in the following for convenience of description that the touch panel TSP is of an embedded type.

Figure 2:
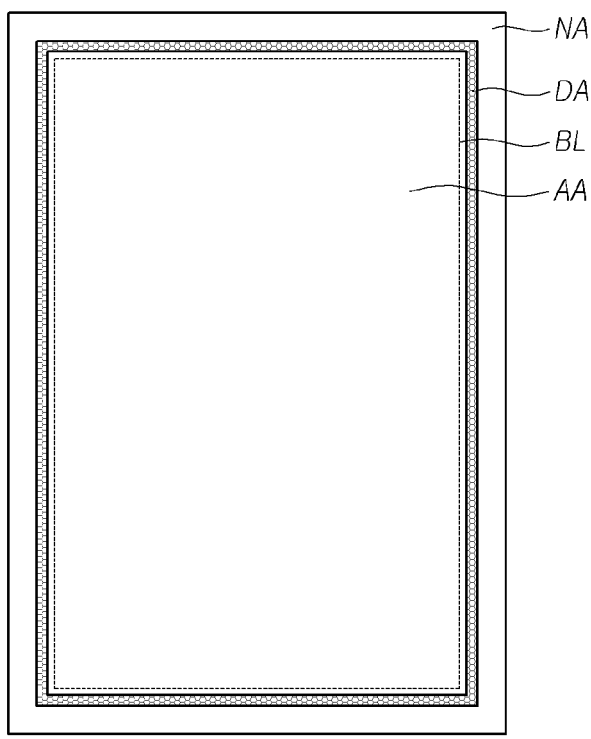
FIG. 2 schematically illustrates a display panel of a touch display device according to example embodiments of the present disclosure.

FIG. 2 schematically illustrates the display panel DISP of the touch display device according to example embodiments of the present disclosure.

Referring to FIG. 2, the display panel DISP may include an active area AA in which an image is displayed and a nonactive area NA which is the outer peripheral area of the outer peripheral boundary line BL of the active area AA.

In the active area AA of the display panel DISP, multiple subpixels for image display are arranged, and various electrodes for display driving or signal lines are arranged.

In the active area AA of the display panel DISP, multiple touch electrodes for touch sensing and multiple touch routing wires electrically connected thereto may also be arranged. As such, the active area AA may also be referred to as a touch sensing area capable of touch sensing.

In the nonactive area NA of the display panel DISP, link lines to which various signal lines arranged in the active area AA extend, or link lines electrically connected to various signal lines arranged in the active area AA, and pads electrically connected to the link lines may be arranged. Display driving circuits DDC, GDC, and the like may be bonded or electrically connected to the pads arranged in the nonactive area NA.

Furthermore, in the nonactive area NA of the display panel DISP, link lines to which multiple touch routing wires arranged in the active area AA extend, or link lines electrically connected to the multiple touch routing wires arranged in the active area AA, and pads electrically connected to the link lines may be arranged. The touch driving circuit TDC may be bonded or electrically connected to the pads arranged in the nonactive area NA.

In the nonactive area NA, there may exist an extension of a part of the outermost touch electrode among the multiple touch electrodes arranged in the active area AA, and at least one electrode (touch electrode) made of the same material as that of the multiple touch electrodes arranged in the active area AA may be additionally arranged.

That is, all of the multiple touch electrodes arranged on the display panel DISP may exist in the active area AA; some (for example, the outermost touch electrode) of the multiple touch electrodes arranged on the display panel DISP may exist in the nonactive area NA; or some (for example, the outermost touch electrode) of the multiple touch electrodes arranged on the display panel DISP may exist both in the active area AA and in the nonactive area NA.

Referring to FIG. 2, the display panel DISP of the touch display device according to example embodiments of the present disclosure may include a dam area DA having a dam arranged therein so as to prevent collapse of a specific layer (for example, an encapsulation portion on an organic light-emitting display panel) in the active area AA.

The dam area DA may be positioned at the boundary point between the active area AA and the nonactive area NA, at a point in the nonactive area NA, which is the outer peripheral area of the active area AA, or the like.

The dam arranged in the dam area DA may be arranged to surround the active area AA in all directions, or arranged only on the outer periphery of one part or at least two parts (for example, a part having an easily collapsible layer) of the active area AA.

The dam arranged in the dam area DA may be a single pattern that is entirely connected, or at least two patterns that are isolated. In the dam area DA, only a primary dam may be arranged, two dams (a primary dam and a secondary dam) may be arranged, or at least three dams may be arranged.

In the dam area DA, only the primary dam may exist in one direction, and both the primary and secondary dams may exist in another direction.

Figure 3:
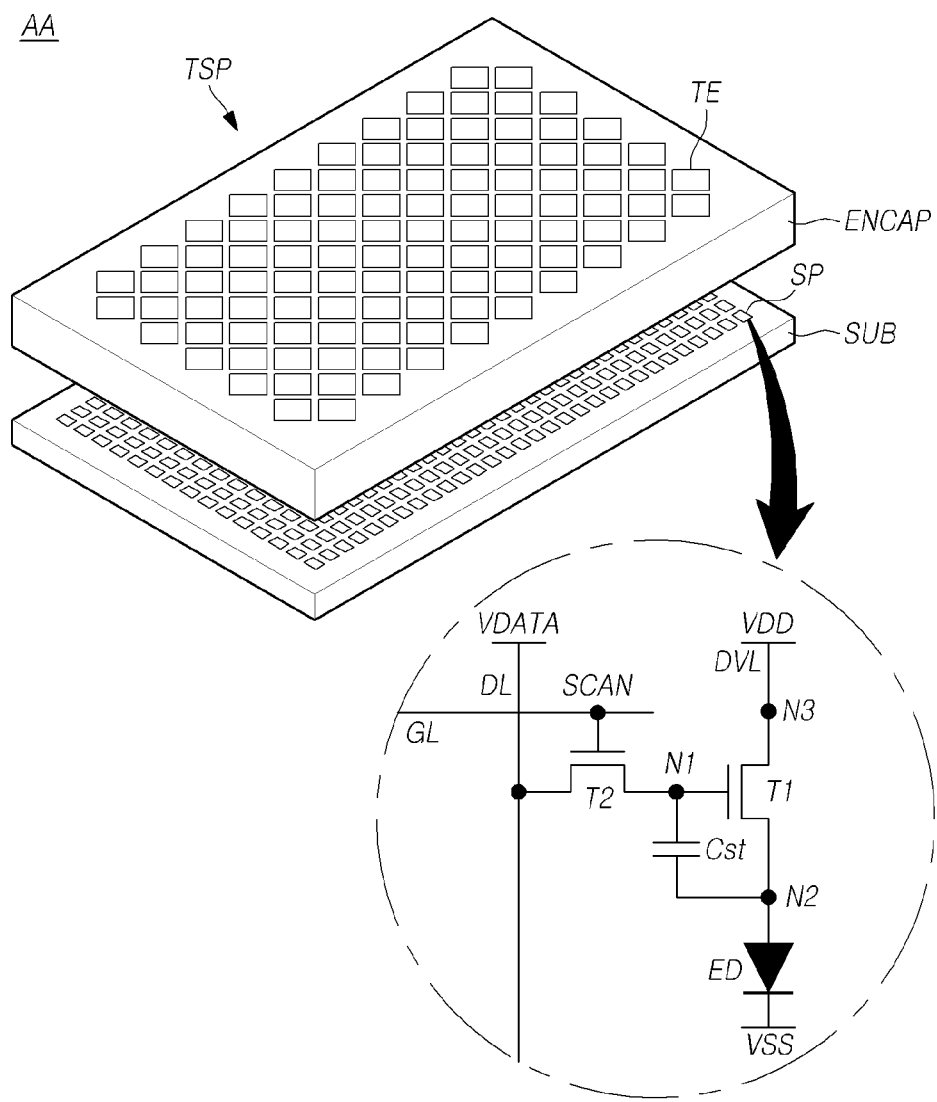
FIG. 3 illustrates an exemplary structure in which a touch panel is embedded in a display panel according to example embodiments of the present disclosure.

FIG. 3 illustrates an exemplary structure in which a touch panel TSP is embedded in a display panel DISP according to example embodiments of the present disclosure.

Referring to FIG. 3, in the active area AA of the display panel DISP, multiple subpixels SP are arranged on the substrate SUB.

Each subpixel SP may include: a light-emitting element ED; a first transistor T1 for driving the light-emitting element ED; a second transistor T2 for transferring a data voltage VDATA to the first node N1 of the first transistor T1; a storage capacitor Cst for maintaining a predetermined voltage for one frame; and the like.

The first transistor T1 may include a first node N1 to which a data voltage may be applied; a second node N2 electrically connected to the light-emitting element ED; and a third node N3 to which a driving voltage VDD is applied from a driving voltage line DVL. The first node N1 may be a gate node; the second node N2 may be a source node or a drain node; and the third node N3 may be a drain node or a source node. The first transistor T1 is also referred to as a driving transistor for driving the light-emitting element ED.

The light-emitting element ED may include a first electrode (for example, an anode electrode), a light-emitting layer, and a second electrode (for example, a cathode electrode). The first electrode may be electrically connected to the second node N2 of the first transistor T1, and a base voltage VSS may be applied to the second electrode.

The light-emitting layer of the light-emitting element ED may be an organic light-emitting layer including an organic material. In this case, the light-emitting element ED may be an organic light-emitting diode (OLED).

The second transistor T2 is controlled to be turned on/off by a scan signal SCAN applied through a gate line GL, and may be electrically connected between the first node N1 of the first transistor T1 and the data line DL. The second transistor T2 is also referred to as a switching transistor.

When the second transistor T2 is turned on by the scan signal SCAN, the second transistor T2 transfers the data voltage VDATA supplied from the data line DL to the first node N1 of the first transistor T1.

The storage capacitor Cst may be electrically connected between the first node N1 of the first transistor T1 and the second node N2 thereof.

Each subpixel SP may include two transistors T1 and T2 and one capacitor Cst as illustrated in FIG. 3, thereby having a 2T1C structure, and, if necessary, may further include at least one transistor or at least one capacitor.

The storage capacitor Cst may not be a parasitic capacitor (for example, Cgs or Cgd) which is an internal capacitor that may exist between the first node N1 of the first transistor T1 and the second node N2 thereof, but an external capacitor which is designed outside the first transistor T1.

Each of the first transistor T1 and the second transistor T2 may be an n-type transistor or a p-type transistor.

As mentioned above, circuit elements such as a light-emitting element ED, at least two transistors T1 and D2, and at least one capacitor Cst are arranged on the display panel DISP. Since such circuit elements (particularly, the light-emitting element ED) are susceptible to external moisture or oxygen, an encapsulation portion ENCAP may be arranged on the display panel DISP in order to prevent external moisture or oxygen from penetrating into the circuit elements (particularly, the light-emitting element ED)).

The encapsulation portion ENCAP may be made of a single layer or multiple layers.

In connection with the touch display device according to example embodiments of the present disclosure, the touch panel TSP may be formed on the encapsulation portion ENCAP.

That is, in connection with the touch display device, touch sensor structures such as multiple touch electrodes TE constituting the touch panel TSP may be arranged on the encapsulation portion ENCAP.

During touch sensing, a touch driving signal or a touch sensing signal may be applied to the touch electrodes TE. Accordingly, during touch sensing, a potential difference may be formed between a touch electrode TE and a cathode electrode, which are arranged with the encapsulation portion ENCAP interposed therebetween, thereby forming an unnecessary parasitic capacitance. Since such a parasitic capacitance may degrade the touch sensitivity, the distance between the touch electrode TE and the cathode electrode may be designed to have at least a predetermined value (for example, 1 μm) in view of the panel thickness, the panel fabrication process, the display performance, and the like such that the parasitic capacitance is reduced. To this end, the thickness of the encapsulation portion ENCAP may be designed, for example, such that the minimum value thereof is at least 1 μm.

Figure 4:
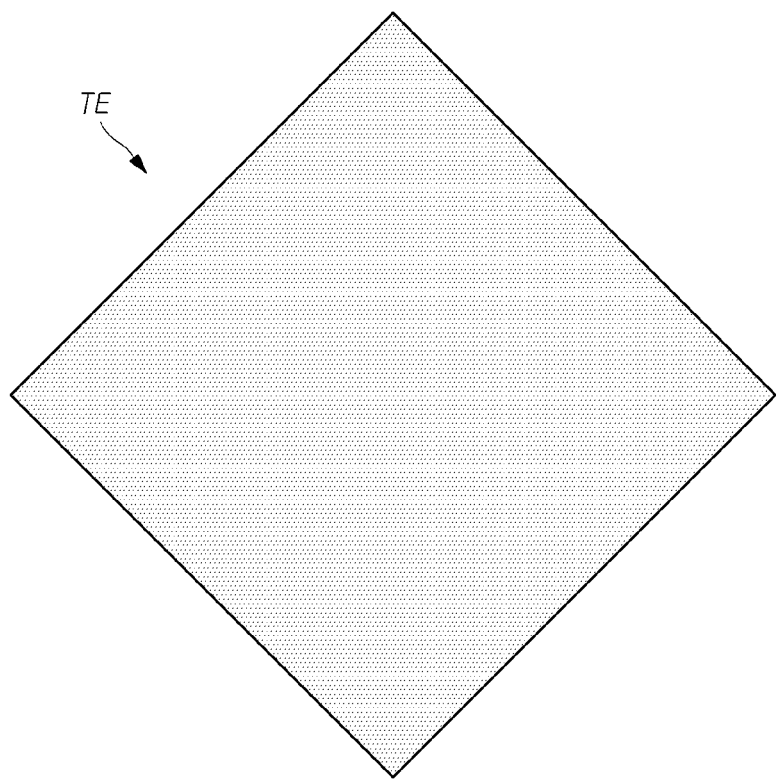
FIG. 4 and FIG. 5 illustrate exemplary types of touch electrodes arranged on a display panel according to example embodiments of the present disclosure.
Figure 5:
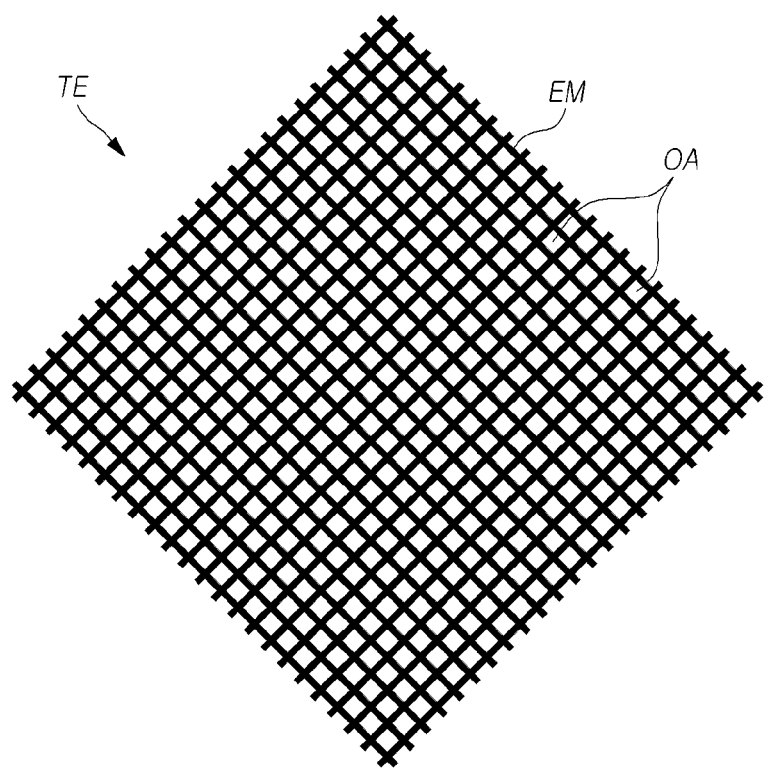

FIG. 4 and FIG. 5 illustrate exemplary types of touch electrodes TE arranged on a display panel DISP according to example embodiments of the present disclosure.

As illustrated in FIG. 4, each touch electrode TE arranged on the display panel DISP may be a plate-shaped electrode metal having no opening. In this case, each touch electrode TE may be a transparent electrode. That is, each touch electrode TE may be made of a transparent electrode material such that light emitted from multiple subpixels SP arranged below the same can be transmitted upward.

Alternatively, as illustrated in FIG. 5, each touch electrode TE arranged on the display panel DISP may be an electrode metal ME that is patterned in a mesh type so as to have at least two openings OA.

The electrode metal EM is a part corresponding to a substantial touch electrode TE, and a touch driving signal is applied to the part, or a touch sensing signal is sensed thereby.

As illustrated in FIG. 5, when each touch electrode TE is an electrode metal EM patterned in a mesh type, at least two openings OA may exist in the area of the touch electrodes TE.

Each of the at least two openings OA existing in each touch electrode TE may correspond to the light-emitting area of at least one subpixel SP. That is, the multiple openings OA serve as a path along which light emitted from the multiple subpixels SP arranged below the same passes upward. It will be assumed in the following for convenience of description that each touch electrode TE is a mesh-type electrode metal EM.

The electrode metal EM corresponding to each touch electrode TE may be positioned on a bank arranged in an area other than the light-emitting area of at least two subpixels SP.

As a method of forming multiple touch electrodes TE, an electrode metal EM may be formed widely in a mesh type, and the electrode metal EM may then be cut in a predetermined pattern such that the electrode metal EM is electrically separated, thereby making multiple touch electrodes TE.

The outer peripheral line of the touch electrodes TE may have the shape of a quadrangle, such as a diamond or a rhombus, as illustrated in FIG. 4 and FIG. 5, or may have various shapes such as a triangle, a pentagon, and a hexagon.

Figure 6:
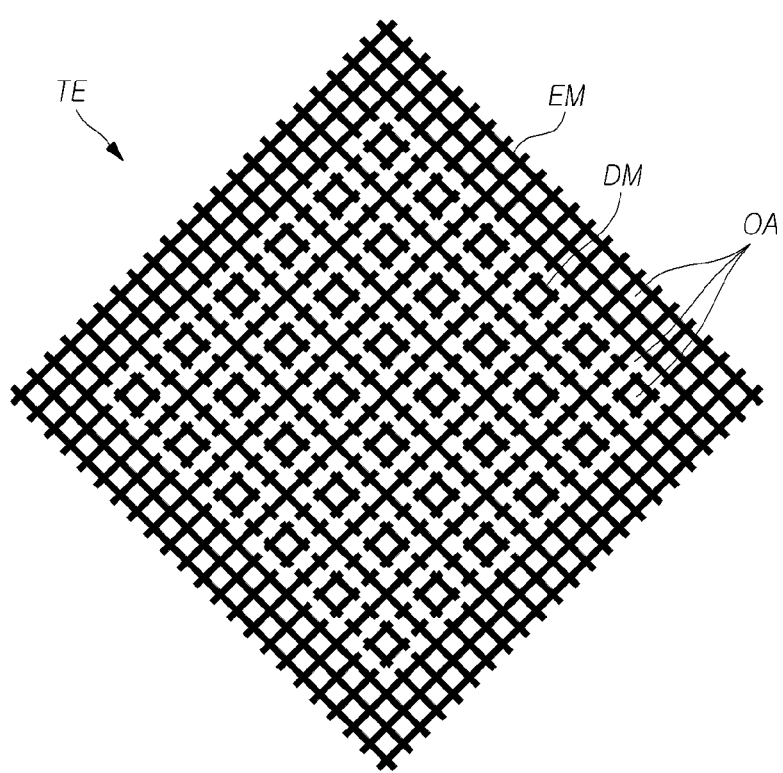
FIG. 6 illustrates an example of the mesh-type touch electrode of FIG. 5 according to example embodiments of the present disclosure.

FIG. 6 illustrates an example of the mesh-type touch electrodes TE of FIG. 5.

Referring to FIG. 6, in the area of each touch electrode TE, there may exist a mesh-type electrode metal EM and at least one discontinuous dummy metal DM.

The electrode metal EM is a part corresponding to a substantial touch electrode TE, and a touch driving signal is applied to the part, or a touch sensing signal is sensed thereby. However, although the dummy metal DM exists in the area of the touch electrode TE, no touch driving signal is applied thereto, and no touch sensing signal is sensed thereby. That is, the dummy metal DM may be an electrically floating metal.

Accordingly, the electrode metal EM may be electrically connected to the touch driving circuit TDC, but the dummy metal DM is not electrically connected to the touch driving circuit TDC.

In the area of every touch electrode TE, at least one dummy metal DM may exist while being disconnected from the electrode metal EM.

Alternatively, at least one dummy metal DM may exist while being disconnected from the electrode metal EM in the area of each touch electrode TE of some of all touch electrodes TE. That is, no dummy metal DM may exist in the area of some touch electrodes TE.

In connection with the role of the dummy metal DM, when at least one dummy metal DM does not exist in the area of the touch electrode TE, as illustrated in FIG. 5, but only a mesh-type electrode metal EM exists, the contour of the electrode metal EM may be visible on the screen, in other words, the visibility issue may occur.

In contrast, when at least one dummy metal DM exists in the area of the touch electrode TE as illustrated in FIG. 6, the contour of the electrode metal EM may not appear on the screen, that is, the visibility issue may be prevented.

It is also possible to adjust, with regard to each touch electrode TE, whether or not a dummy metal DM exists or the number of dummy metals DM (dummy metal ratio) such that the touch sensitivity can be improved by adjusting the magnitude of capacitance with regard to each touch electrode TE.

Some spots of an electrode metal EM formed in the area of one touch electrode TE may be cut such that the electrode metal EM that has been cut form a dummy metal DM. That is, the electrode metal EM and the dummy metal DM may be formed on the same layer with the same material.

The touch display device according to example embodiments of the present disclosure may sense a touch on the basis of the capacitance formed on a touch electrode TE.

As a capacitance-based touch sensing type, the touch display device according to example embodiments of the present disclosure may sense a touch in a mutual-capacitance-based touch sensing type or may sense a touch in a self-capacitance-based touch sensing type.

In the case of the mutual-capacitance-based touch sensing type, multiple touch electrodes TE may be classified into a driving touch electrode (transmission touch electrode) to which a touch driving signal is applied, and a sensing touch electrode (reception touch electrode) which detects a touch sensing signal, and which forms a capacitance with the driving touch electrode.

In the case of the mutual-capacitance-based touch sensing type, the touch sensing circuit TSC senses whether or not a touch exists and/or the touch coordinate on the basis of a change in the capacitance (mutual capacitance) between the driving touch electrode and the sensing touch electrode according to whether or not there exists a pointer such as a finger or a pen.

In the case of the self-capacitance-based touch sensing type, each touch electrode TE has both the role of a driving touch electrode and that of a sensing touch electrode. That is, the touch sensing circuit TSC applies a touch driving signal to at least one touch electrode TE, detects a touch sensing signal through the touch electrode TE to which the touch driving signal has been applied, identifies a change in capacitance between the pointer such as a finger or a pen and the touch electrode TE on the basis of the detected touch sensing signal, and accordingly senses whether or not there is a touch and/or the touch coordinate. In the case of the self-capacitance-based touch sensing type, there is no distinction between the driving touch electrode and the sensing touch electrode.

It is also possible to perform self-capacitance-based touch sensing in a structure for mutual-capacitance-based touch sensing, if necessary. For example, a touch driving signal may be applied to each of a driving touch electrode and a sensing touch electrode, which are for the purpose of mutual-capacitance-based touch sensing, and a touch sensing signal may be detected through the touch electrode TE to which the touch driving signal has been applied, thereby performing touch sensing. That is, in an electrode structure for mutual-capacitance-based touch sensing, mutual-capacitance-based touch sensing and self-capacitance-based touch sensing may be performed both.

As such, the touch display device according to example embodiments of the present disclosure may either sense a touch in the mutual-capacitance-based touch sensing type or sense a touch in the self-capacitance-based touch sensing type. However, it will be assumed in the following for convenience of description that the touch display device performs the mutual-capacitance-based touch sensing and has a touch sensor structure for the same.

Figure 7:
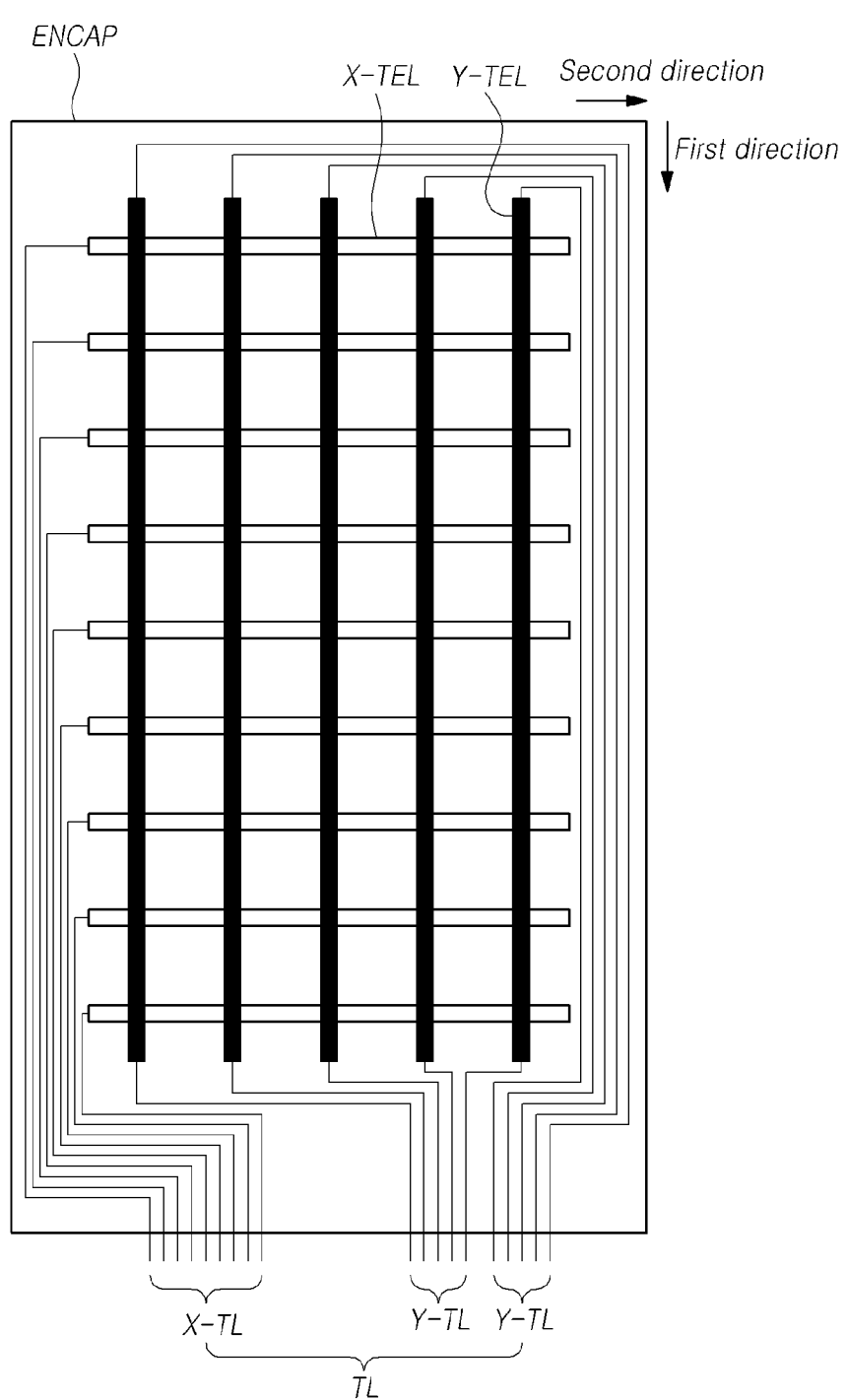
FIG. 7 illustrates a schematic touch sensor structure in connection with a display panel according to example embodiments of the present disclosure.
Figure 8:
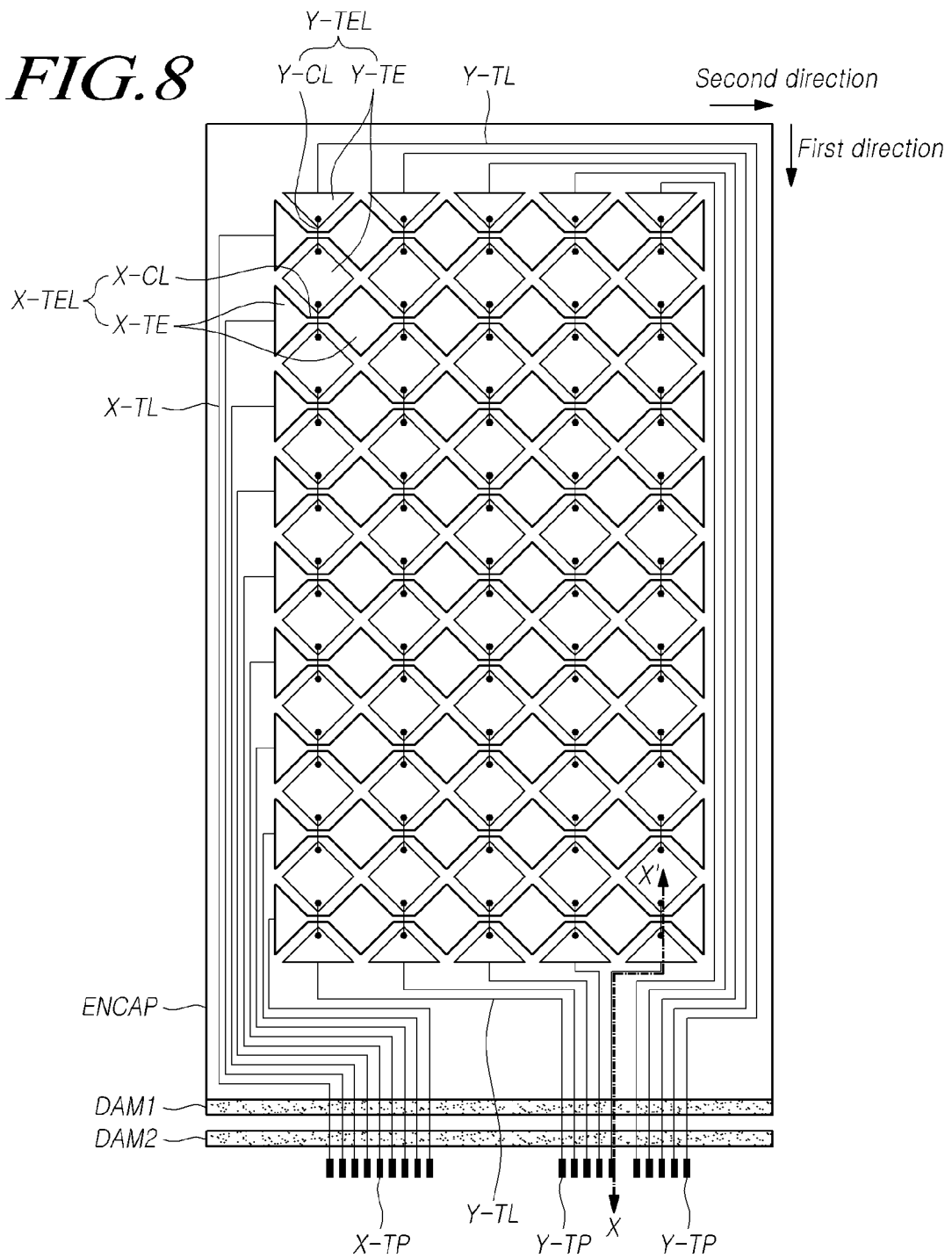
FIG. 8 illustrates an exemplary implementation of the touch sensor structure of FIG. 7 according to example embodiments of the present disclosure.

FIG. 7 illustrates a schematic touch sensor structure in connection with a display panel DISP according to example embodiments of the present disclosure, and FIG. 8 illustrates an exemplary implementation of the touch sensor structure of FIG. 7.

Referring to FIG. 7, the touch sensor structure for mutual-capacitance-based touch sensing may include multiple X-touch electrode lines X-TEL and multiple Y-touch electrode lines Y-TEL. In this regard, the multiple X-touch electrode lines X-TEL and the multiple Y-touch electrode lines Y-TEL are positioned on an encapsulation portion ENCAP.

Each of the multiple X-touch electrode lines X-TEL may be arranged in a second direction, and each of the multiple Y-touch electrode lines Y-TEL may be arranged in a first direction that is different from the second direction.

As used herein, the first direction and the second direction may be different from each other. For example, the first direction may be the y-axis direction, and the second direction may be the x-axis direction. To the contrary, the first direction may be the x-axis direction, and the second direction may be the y-axis direction. The first direction and the second direction may be perpendicular to each other, and may not be perpendicular to each other. As used herein, rows and columns are relative, and rows and columns may be switched depending on the point of view.

Each of the multiple X-touch electrode lines X-TEL may include multiple X-touch electrodes X-TE that are electrically connected. Each of the multiple Y-touch electrode lines Y-TEL may include multiple Y-touch electrodes Y-TE that are electrically connected.

The multiple X-touch electrodes X-TE and the multiple Y-touch electrodes Y-TE are included in multiple touch electrodes TE such that the roles (functions) thereof are distinguished.

For example, multiple X-touch electrodes X-TE constituting each of the multiple X-touch electrode lines X-TEL may be driving touch electrodes, and multiple Y-touch electrodes Y-TE constituting each of the multiple Y-touch electrode lines Y-TEL may be sensing touch electrodes. In this case, each of the multiple X-touch electrode lines X-TEL corresponds to a driving touch electrode line, and each of the multiple Y-touch electrode lines Y-TEL corresponds to a sensing touch electrode line.

To the contrary, multiple X-touch electrodes X-TE constituting each of the multiple X-touch electrode lines X-TEL may be sensing touch electrodes, and multiple Y-touch electrodes Y-TE constituting each of the multiple Y-touch electrode lines Y-TEL may be driving touch electrodes. In this case, each of the multiple X-touch electrode lines X-TEL corresponds to a sensing touch electrode line, and each of the multiple Y-touch electrode lines Y-TEL corresponds to a driving touch electrode line.

The touch sensor metal for touch sensing may include multiple touch routing wires TL besides the multiple X-touch electrode lines X-TEL and the multiple Y-touch electrode lines Y-TEL.

The multiple touch routing wires TL may include at least one X-touch routing wire X-TL connected to each of the multiple X-touch electrode lines X-TEL and at least one Y-touch routing wire Y-TL connected to each of the multiple Y-touch electrode lines Y-TEL.

Referring to FIG. 8, each of the multiple X-touch electrode lines X-TEL may include a plurality of X-touch electrodes X-TE arranged in the same row (or column) and at least one X-touch electrode connection wire X-CL that electrically connects the same. An X-touch electrode connection wire X-CL that connects two adjacent X-touch electrodes X-TE may be a metal integrated with the two adjacent X-touch electrodes X-TE (the example of FIG. 8) or may be a metal connected to the two adjacent X-touch electrodes X-TE through a contact hole.

Each of the multiple Y-touch electrode lines Y-TEL may include a plurality of Y-touch electrodes Y-TE arranged in the same column (or row) and at least one Y-touch electrode connection wire Y-CL that electrically connects the same. A Y-touch electrode connection wire Y-CL that connects two adjacent Y-touch electrodes Y-TE may be a metal integrated with the two adjacent Y-touch electrodes Y-TE or may be a metal connected to the two adjacent Y-touch electrodes Y-TE through a contact hole (the example of FIG. 8).

The X-touch electrode connection wire X-CL or the Y-touch electrode connection wire Y-CL, which is connected to an X-touch electrode X-TE or a Y-touch electrode Y-TE through a contact hole, may be referred to as "a connection pattern".

In an area in which an X-touch electrode line X-TEL and a Y-touch electrode line Y-TEL intersect (touch electrode line intersection area), an X-touch electrode connection wire X-CL and a Y-touch electrode connection wire Y-CL may intersect.

When an X-touch electrode connection wire X-CL and a Y-touch electrode connection wire Y-CL intersect in a touch electrode line intersection area in this manner, the X-touch electrode connection wire X-CL and the Y-touch electrode connection wire Y-CL need to be positioned on different layers.

Accordingly, in order for multiple X-touch electrode lines X-TEL and multiple Y-touch electrode lines Y-TEL to be arranged so as to intersect, the multiple X-touch electrodes X-TE, the multiple X-touch electrode connection wires X-CL, the multiple Y-touch electrodes Y-TE, the multiple Y-touch electrode lines Y-TEL, and the multiple Y-touch electrode connection wires Y-CL may be positioned on at least two layers.

Referring to FIG. 8, each of the multiple X-touch electrode lines X-TEL is electrically connected to the corresponding X-touch pad X-TP through at least one X-touch routing wire X-TL. That is, the X-touch electrode X-TE arranged the furthest to the outside among the plurality of X-touch electrodes X-TE included in one X-touch electrode line X-TEL is electrically connected to the corresponding X-touch pad X-TP through an X-touch routing wire X-TL.

Each of the multiple Y-touch electrode lines Y-TEL is electrically connected to the corresponding Y-touch pad Y-TP through at least one Y-touch routing wire Y-TL. That is, the Y-touch electrode Y-TE arranged the furthest to the outside among the plurality of Y-touch electrodes Y-TE included in one Y-touch electrode line Y-TEL is electrically connected to the corresponding Y-touch pad Y-TP through a Y-touch routing wire Y-TL.

As illustrated in FIG. 8, the multiple X-touch electrode lines X-TEL and the multiple Y-touch electrode lines Y-TEL may be arranged on an encapsulation portion ENCAP. That is, multiple X-touch electrodes X-TE and multiple X-touch electrode connection wires X-CL, which constitute multiple X-touch electrode lines X-TEL, may be arranged on an encapsulation portion ENCAP. Multiple Y-touch electrodes Y-TE and multiple Y-touch electrode connection wires Y-CL, which constitute multiple Y-touch electrode lines Y-TEL, may be arranged on the encapsulation portion ENCAP.

As illustrated in FIG. 8, each of the multiple X-touch routing wires X-TL, which are electrically connected to the multiple X-touch electrode lines X-TEL, may be arranged on the encapsulation portion ENCAP and may extend to a location at which the encapsulation portion ENCAP does not exist such that the same is electrically connected to multiple X-touch pads X-TP. Each of the multiple Y-touch routing wires Y-TL, which are electrically connected to the multiple Y-touch electrode lines Y-TEL, may be arranged on the encapsulation portion ENCAP and may extend to a location at which the encapsulation portion ENCAP does not exist such that the same is electrically connected to multiple Y-touch pads Y-TP. The encapsulation portion ENCAP may be positioned in the active area AA and, if necessary, may be expanded to the nonactive area NA.

As described above, in order to prevent collapse of a specific layer (for example, an encapsulation portion on an organic light-emitting display panel) in the active area AA, a dam DA may exist in the boundary area between the active area AA and the nonactive area NA or in the nonactive area NA, which is the outer peripheral area of the active area AA.

As illustrated in FIG. 8, for example, a primary dam DAM1 and a secondary dam DAM2 may be arranged in the dam area DA. The secondary dam DAM2 may be positioned closer to the outer periphery than the primary dam DAM1.

Unlike the example of FIG. 8, only the primary dam DAM1 may be positioned in the dam area DA. Alternatively, the primary dam DAM1 and the secondary DAM2, and optionally at least one additional dam may be further arranged in the dam area DAM if necessary.

Referring to FIG. 8, the encapsulation portion ENCAP may be positioned on a side surface of the primary DAM1. Alternatively, the encapsulation portion ENCAP may be positioned not only on the side surface of the primary dam DAM1, but also on the upper portion thereof.

Figure 9:
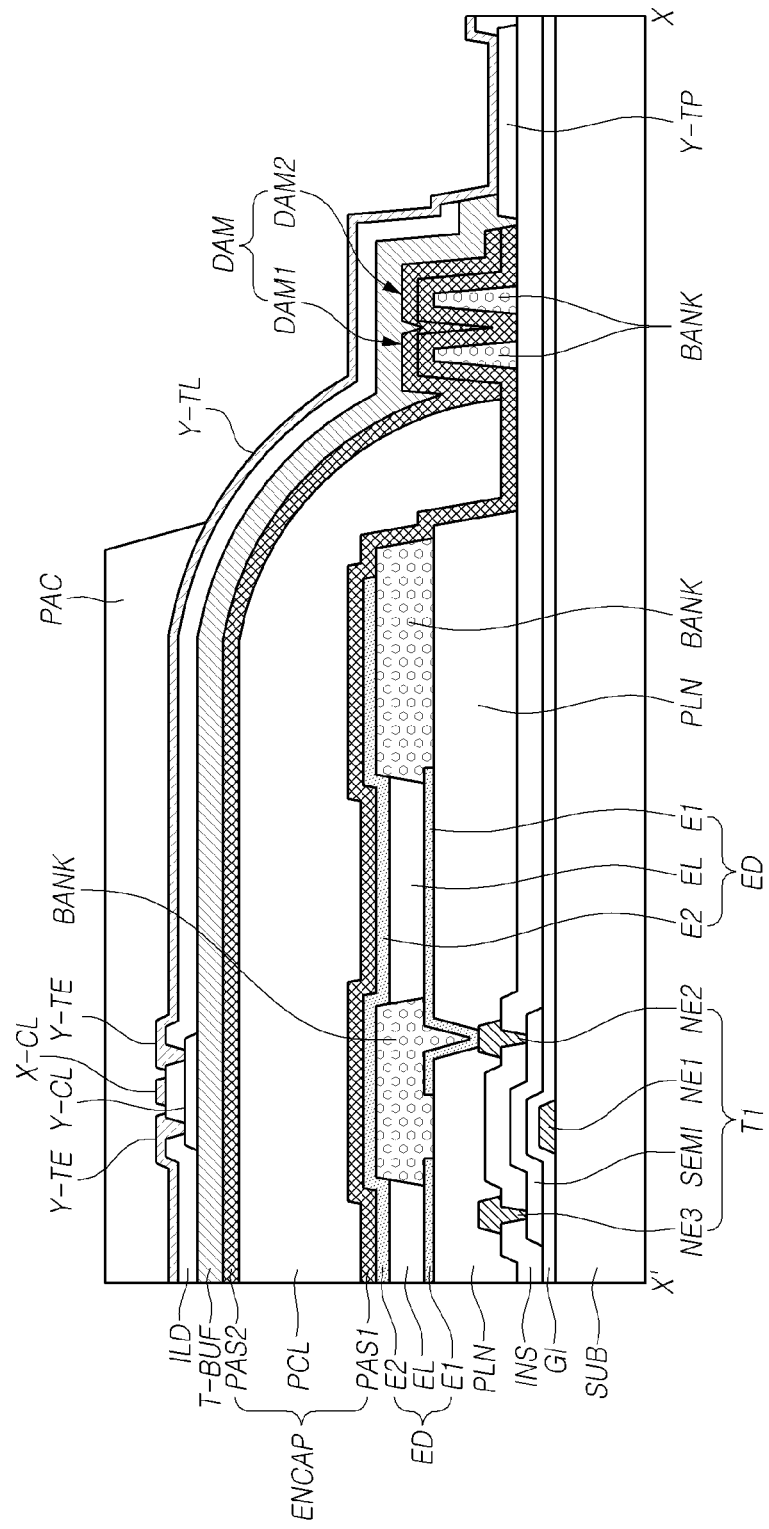
FIG. 9 is a partial sectional view of a display panel according to example embodiments of the present disclosure, and illustrates an exemplary sectional structure of part X-X' illustrated in FIG. 8.

FIG. 9 is a partial sectional view of a display panel DISP according to example embodiments of the present disclosure, and illustrates a sectional view of part X-X' illustrated in FIG. 8. It is to be noted that, although a plate-shaped touch electrode TE is illustrated in FIG. 9, the same is only an example, and may also be configured in a mesh type.

A first transistor T1, which is a driving transistor in each subpixel SP within the active area AA, is arranged on the substrate SUB.

The first transistor T1 includes: a first node electrode NE1 corresponding to a gate electrode; a second node electrode NE2 corresponding to a source electrode or a drain electrode; a third node electrode NE3 corresponding to a drain electrode or a source electrode; a semiconductor layer SEMI; and the like.

The first node electrode NE1 and the semiconductor layer SEMI may overlap each other with a gate insulating layer GI interposed therebetween. The second node electrode NE2 may be formed on an insulating layer INS so as to contact one side of the semiconductor layer SEMI, and the third node electrode NE3 may be formed on the insulating layer INS so as to contact the other side of the semiconductor layer SEMI.

The light-emitting element ED may include: a first electrode E1 corresponding to an anode electrode (or a cathode electrode); a light-emitting layer EL formed on the first electrode E1; a second electrode E2 which is formed on the light-emitting layer EL, and which corresponds to a cathode electrode (or an anode electrode); and the like.

The first electrode E1 is electrically connected to the second node electrode NE2 of the first transistor T1, which is exposed through a pixel contact hole that penetrates a planarization film PLN.

The light-emitting layer EL is formed on a first electrode E1 of a light-emitting area provided by a bank BANK. The light-emitting layer EL is formed by laminating a hole-related layer, a light-emitting layer, and an electron-related layer on the first electrode E1 in this order or in the reverse order. The second electrode E2 is formed to face the first electrode E1 with the light-emitting layer EL interposed therebetween.

The encapsulation portion ENCAP prevents external moisture or oxygen from infiltrating the light-emitting element ED, which is vulnerable to external moisture or oxygen.

The encapsulation portion ENCAP may include a single layer but may also include multiple layers PAS1, PCL, and PAS2 as illustrated in FIG. 9. Encapsulation portion ENCAP may have a sloped (bending) configuration/surface as it extends in the X'-X direction (from X' to edge of DAM). Additional components such as touch wires, ILD and T-BUF (as will be described below) may also extend along the sloped surface of ENCAP.

For example, when the encapsulation portion ENCAP includes multiple layers PAS1, PCL, and PAS2, the encapsulation portion ENCAP may include at least one inorganic encapsulation layer PAS1 and PAS2 and at least one organic encapsulation layer PCL. As a specific example, the encapsulation portion ENCAP may be structured to include a first inorganic encapsulation layer PAS1, an organic encapsulation layer PCL, and a second inorganic encapsulation layer PAS2 laminated successively.

The organic encapsulation layer PCL may further include at least one organic encapsulation layer or at least one inorganic encapsulation layer.

The first inorganic encapsulation layer PAS1 is formed on the substrate SUB, on which a second electrode E2 corresponding to a cathode electrode is formed, to be most adjacent to the light-emitting element ED. The first inorganic encapsulation layer PAS1 is, for example, made of an inorganic insulative material that can be deposited at a low temperature, such as silicon nitride (SiNx), silicon oxide (SiOx), silicon oxynitride (SiON), or aluminum oxide ($Al_2O_3$). Since the first inorganic encapsulation layer PAS1 is deposited in a low-temperature atmosphere, the first inorganic encapsulation layer PAS1 can prevent damage to the light-emitting layer EL including an organic material that is vulnerable to a high-temperature atmosphere during a deposition process.

The organic encapsulation layer PCL may be formed to have an area smaller than that of the first inorganic encapsulation layer PAS1. In this case, the organic encapsulation layer PCL may be formed to expose both ends of the first inorganic encapsulation layer PAS1. The organic encapsulation layer PCL plays the buffering role of buffering stress between respective layers as a result of bending of the touch display device, which is an organic light-emitting display device, and may play the role of enhancing the planarization performance. For example, the organic encapsulation layer PCL may be made of an organic insulation material, such as acrylic resin, epoxy resin, polyimide, polyethylene, or silicon oxycarbide (SiOC).

When the organic encapsulation layer PCL is formed in an inkjet type, one dam or at least two dams DAM may be formed in the boundary area between the nonactive area NA and the active area AA or in a dam area DA, which corresponds to a partial area in the nonactive area NA.

For example, as illustrated in FIG. 9, the dam area DA may be positioned between the active area AA and a pad area in the nonactive area AA, in which multiple X-touch pads X-TP and multiple Y-touch pads Y-TP are formed; and, in the dam area DA, a primary dam DAM1 that is adjacent to the active area AA and a secondary dam DAM2 that is adjacent to the pad area may exist.

The at least one dam DAM arranged in the dam area DA may be configured such that, when a liquid-type organic encapsulation layer PCL drips into the active area AA, the liquid-type organic encapsulation layer PCL is prevented from collapsing toward the nonactive area AA and infiltrating the pad area.

Such an effect may be further enhanced by providing a primary dam DAM1 and a secondary dam DAM2 as illustrated in FIG. 9.

The primary dam DAM1 and/or the secondary damp DAM2 may be formed in a single-layered or multi-layered structure. For example, the primary dam DAM1 and/or the secondary damp DAM2 may be simultaneously formed with the same material as that of at least one among the bank BANK, the spacer (not illustrated), and the like. In this case, a dam structure can be formed without a process of adding a mask and without increasing the cost.

The primary dam DAM1 and/or the secondary damp DAM2 may have such a structure that the first inorganic encapsulation layer PAS1 and/or the second inorganic encapsulation layer PAS2 are laminated on the bank BANK as illustrated in FIG. 9.

The organic encapsulation layer PCL including an organic material may be positioned only on the inner surface of the primary dam DAM1 as illustrated in FIG. 9.

Alternatively, the organic encapsulation layer PCL including an organic material may also be positioned on the upper portion of at least a part of the primary dam DAM1 and the secondary dam DAM2. For example, the organic encapsulation layer PCL may be positioned on the upper portion of the primary dam DAM1.

The second inorganic encapsulation layer PAS2 may be formed on the substrate 111 on which the organic encapsulation layer PCL is formed so as to cover the upper surface and side surface of each of the organic encapsulation layer PCL and the first inorganic encapsulation layer PAS1. The second inorganic encapsulation layer PAS2 minimizes or blocks infiltration of external moisture or oxygen into the first inorganic encapsulation layer PAS1 and the organic encapsulation layer PCL. The second inorganic encapsulation layer PAS2 is, for example, made of an inorganic insulative material such as silicon nitride (SiNx), silicon oxide (SiOx), silicon oxynitride (SiON), or aluminum oxide ($Al_2O_3$).

A touch buffer film T-BUF may be arranged on the encapsulation portion ENCAP. The touch buffer film T-BUF may be positioned between a touch sensor metal, which includes X-touch and Y-touch electrodes X-TE and Y-TE and X-touch and Y-touch electrode connection wires X-CL and Y-CL, and the second electrode E2 of the light-emitting element ED.

The touch buffer film T-BUF may be designed such that the distance of spacing between the touch sensor metal and the second electrode E2 of the light-emitting element ED maintains a predetermined minimum spacing distance (for example, 1 μm). This may reduce or prevent the parasitic capacitance formed between the touch sensor metal and the second electrode E2 of the light-emitting element ED, thereby preventing degradation of touch sensitivity caused by the parasitic capacitance.

It is also possible to arrange a touch sensor metal including X-touch and Y-touch electrodes X-TE and Y-TE and X-touch and Y-touch electrode connection wires X-CL and Y-CL on the encapsulation portion ENCAP, without the touch buffer film T-BUF.

The touch buffer film T-BUF may also block infiltration of a liquid chemical (development liquid, etching liquid, or the like) used during a process of manufacturing the touch sensor metal arranged on the touch buffer film T-BUF, external moisture, or the like into the light-emitting layer EL including an organic material. As such, the touch buffer film T-BUF can prevent damage to the light-emitting layer EL that is vulnerable to liquid chemicals or moisture.

The touch buffer film T-BUF is made of an organic insulative material which can be formed at a low temperature equal to or lower than a predetermined temperature (for example, 100° C.), and which has a low permittivity of 1-3, in order to prevent damage to the light-emitting layer EL including an organic material that is vulnerable to a high temperature. For example, the touch buffer film T-BUF may be made of an acrylate-based material, an epoxy-based material, or a siloxane-based material. The touch buffer film T-BUF, which is made of an organic insulative material and thus has a planarization performance, may prevent damage to respective encapsulation layers PAS1, PCL, and PAS2 constituting the encapsulation portion ENCAP and fracture of the touch sensor metal formed on the touch buffer film T-BUF as a result of bending of the organic light-emitting display device.

According to the mutual-capacitance-based touch sensor structure, an X-touch electrode line X-TEL and a Y-touch electrode line Y-TEL may be arranged on the touch buffer film T-BUF, and the X-touch electrode line X-TEL and the Y-touch electrode line Y-TEL may be arranged so as to intersect.

The Y-touch electrode line Y-TEL may include multiple Y-touch electrodes Y-TE and multiple Y-touch electrode connection wires Y-CL that electrically connect between the multiple Y-touch electrodes Y-TE.

As illustrated in FIG. 9, the multiple Y-touch electrodes Y-TE and the multiple Y-touch electrode connection wires Y-CL may be positioned on different layers with the touch insulating film ILD interposed therebetween.

The multiple Y-touch electrodes Y-TE may be spaced apart by a predetermined interval along the y-axis direction. Each of the multiple Y-touch electrodes Y-TE may be electrically connected to a different Y-touch electrode Y-TE that is adjacent in the y-axis direction through a Y-touch electrode connection wire Y-CL.

The Y-touch electrode connection wire Y-CL may be formed on the touch buffer film T-BUF, exposed through a touch contact hole that penetrates the touch insulating film ILD, and electrically connected to two Y-touch electrodes Y-TE that are adjacent in the y-axis direction.

The Y-touch electrode connection wire Y-CL may be arranged so as to overlap with the bank BANK. This may prevent degradation of the aperture ratio due to the Y-touch electrode connection wire Y-CL.

The X-touch electrode line X-TEL may include multiple X-touch electrodes X-TE and multiple X-touch electrode connection wires X-CL that electrically connect between the multiple X-touch electrodes X-TE. The multiple X-touch electrodes X-TE and the multiple X-touch electrode connection wires X-CL may be positioned on different layers with the touch insulating film ILD interposed therebetween.

The multiple X-touch electrodes X-TE may be spaced apart by a predetermined interval along the x-axis direction on the touch insulating film ILD. Each of the multiple X-touch electrodes X-TE may be electrically connected to a different X-touch electrode X-TE that is adjacent in the x-axis direction through an X-touch electrode connection wire X-CL.

The X-touch electrode connection wire X-CL may be arranged on the same plane with the X-touch electrodes X-TE and electrically connected to two X-touch electrodes X-TE that are adjacent in the x-axis direction without a separate contact hole, or may be integrated with two X-touch electrodes X-TE that are adjacent in the x-axis direction.

The X-touch electrode connection wire X-CL may be arranged so as to overlap with the bank BANK. This may prevent degradation of the aperture ratio due to the X-touch electrode connection wire X-CL.

The Y-touch electrode lines Y-TEL may be electrically connected to the touch driving circuit TDC through a Y-touch routing wire Y-TL and a Y-touch pad Y-TP. Likewise, the X-touch electrode lines X-TEL may be electrically connected to the touch driving circuit TDC through an X-touch routing wire X-TL and an X-touch pad X-TP.

A pad cover electrode may be additionally arranged to cover the X-touch pad X-TP and the Y-touch pad Y-TP.

The X-touch pad X-TP may be formed separately from the X-touch routing wire X-TL or may be formed by extension of the X-touch routing wire X-TL. The Y-touch pad Y-TP may be formed separately from the Y-touch routing wire Y-TL or may be formed by extension of the Y-touch routing wire Y-TL.

When the X-touch pad X-TP is formed by extension of the X-touch routing wire X-TL, and when the Y-touch pad Y-TP may be formed by extension of the Y-touch routing wire Y-TL, the X-touch pad X-TP, the X-touch routing wire X-TL, the Y-touch pad Y-TP, and the Y-touch routing wire Y-TL may be made of the same first conductive material. As the first conductive material, a metal having storing resistance to corrosion and acidity and having excellent conductivity, such as Al, Ti, Cu, and Mo, may be used to form a single-layered or multi-layered structure.

For example, the X-touch pad X-TP, the X-touch routing wire X-TL, the Y-touch pad Y-TP, and the Y-touch routing wire Y-TL, which are made of the first conductive material, may be formed in a three-layered structure including laminated Ti/Al/Ti or Mo/Al/Mo, for example.

The pad cover electrode capable of covering the X-touch pad X-TP and the Y-touch pad Y-TP may be made of a second conductive material that is identical to the material of the X-touch and Y-touch electrodes X-TE and Y-TE. The second conductive material may be a transparent conductive material having strong resistance to corrosion and acidity, such as ITO or IZO. The pad cover electrode may be formed to be exposed by the touch buffer film T-BUF such that the same is bonded to the touch driving circuit TDC or bonded to a circuit film on which the touch driving circuit TDC is mounted.

The touch buffer film T-BUF may be formed to cover the touch sensor metal such that the touch sensor metal is prevented from being corroded by external moisture or the like. For example, the touch buffer film T-BUF may be made of an organic insulative material, a circular polarizing plate, or an epoxy-based or acrylate-based film. The touch buffer film T-BUF may not exist on the encapsulation portion ENCAP. That is, the touch buffer film T-BUF may not be an essential feature.

The Y-touch routing wire Y-TL may be electrically connected to the Y-touch electrode Y-TE through a touch routing wire contact hole or may be integrated with the Y-touch electrode Y-TE.

The Y-touch routing wire Y-TL may extend to the non-active area NA and extend past the upper portion and side surface of the encapsulation portion ENCAP and past the upper portion and side surface of the dam DAM so as to be electrically connected to the Y-touch pad Y-TP. Accordingly, the Y-touch routing wire Y-TL may be electrically connected to the touch driving circuit TDC through the Y-touch pad Y-TP.

The Y-touch routing wire Y-TL may transfer a touch sensing signal from the Y-touch electrode Y-TE to the touch driving circuit TDC, or may receive a touch driving signal from the touch driving circuit TDC and transfer the same to the Y-touch electrode Y-TE.

The X-touch routing wire X-TL may be electrically connected to the X-touch electrode X-TE through a touch routing wire contact hole or integrated with the X-touch electrode X-TE.

The X-touch routing wire X-TL may extend to the non-active area NA and extend past the upper portion and side surface of the encapsulation portion ENCAP and past the upper portion and side surface of the dam DAM so as to be electrically connected to the X-touch pad X-TP. Accordingly, the X-touch routing wire X-TL may be electrically connected to the touch driving circuit TDC through the X-touch pad X-TP.

The X-touch routing wire X-TL may receive a touch driving signal from the touch driving circuit TDC and transfer the same to the X-touch electrode X-TE, and may transfer a touch sensing signal from the X-touch electrode X-TE to the touch driving circuit TDC.

The arrangement of the X-touch routing wire X-TL and the Y-touch routing wire Y-TL may be modified according to panel design requirements.

A touch protective film PAC may be arranged on the X-touch electrode X-TE and the Y-touch electrode Y-TE. The touch protective film PAC may extend to the front or rear side of the dam DAM so as to be arranged on the X-touch routing wire X-TL and the Y-touch routing wire Y-TL as well.

It is to be noted that the sectional view of FIG. 9 illustrates a conceptual structure; the position, thickness, or width of respective patterns (various kinds of layers or electrodes) may vary depending on the direction of observation or position; the connecting structure of various kinds of patterns may also be modified; additional layers may further exist besides the illustrated layers; and some of the illustrated layers may be omitted or integrated. For example, the width of the bank BANK may be smaller than illustrated, and the height of the dam DAM may be smaller or larger than illustrated.

Figure 10:
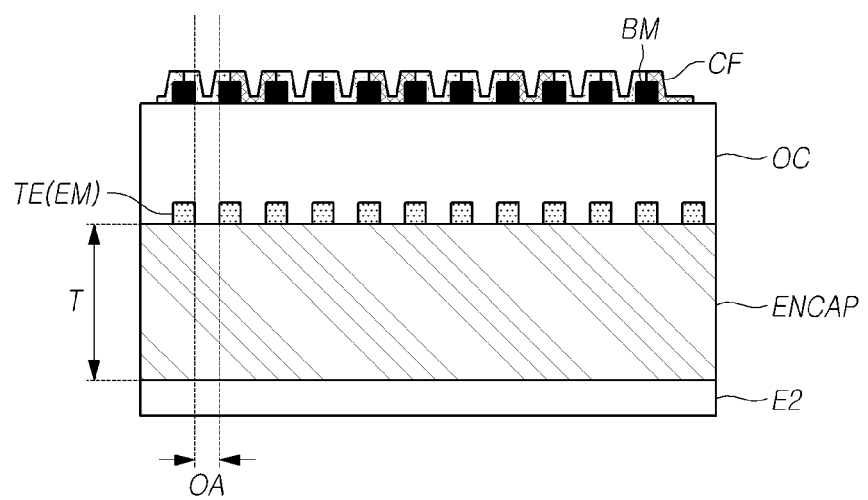
FIG. 10 and FIG. 11 illustrate exemplary sectional structures when a display panel according to example embodiments of the present disclosure includes a color filter.
Figure 11:
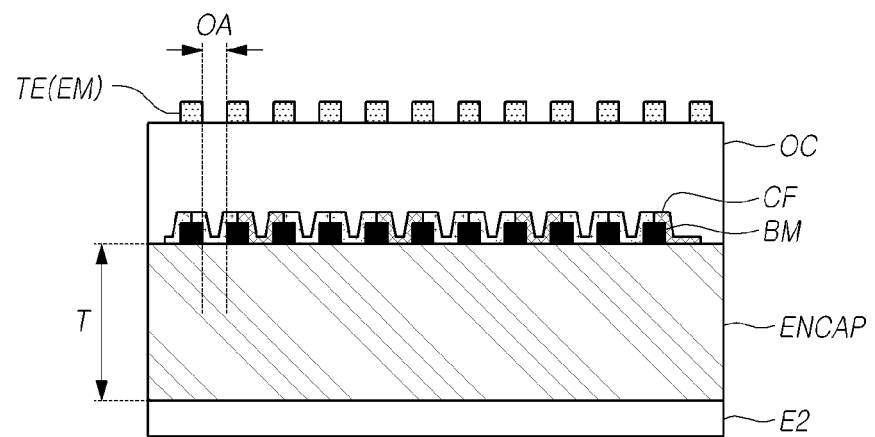

FIG. 10 and FIG. 11 illustrate exemplary sectional structures when a display panel DISP according to example embodiments of the present disclosure includes a color filter CF.

Referring to FIG. 10 and FIG. 11, when the touch panel TSP is embedded in the display panel DISP, and when the display panel DISP is implemented as an organic light-emitting display panel, the touch panel TSP may be positioned on the encapsulation portion ENCAP inside the display panel DISP. In other words, a touch sensor metal including multiple touch electrodes TE, multiple touch routing wires TL, and the like may be positioned on the encapsulation portion ENCAP inside the display panel DISP.

As described above, forming touch electrodes TE on the encapsulation portion ENCAP makes it possible to form touch electrodes TE without any substantial influence on the display performance and display-related layer formation.

Referring to FIG. 10 and FIG. 11, a second electrode E2 may be positioned beneath the encapsulation portion ENCAP, and may be a cathode electrode of an OLED.

The encapsulation portion ENCAP may have a thickness T of at least one micrometer, for example.

As described above, designing the thickness of the encapsulation portion ENCAP to be at least one micrometer may reduce the parasitic capacitance formed between the second electrode E2 of the OLED and the touch electrodes TE. This may prevent degradation of touch sensitivity due to the parasitic capacitance.

As described above, each of the multiple touch electrodes TE may be configured such that the electrode metal EM is patterned in a mesh type so as to have at least two openings OA, and each of the at least two openings OA may correspond to at least one subpixel or the light-emitting area thereof when seen in the vertical direction.

As described above, the electrode metal ME of the touch electrodes TE may be patterned such that the light-emitting area of at least one subpixel corresponds to and exist in the position of each of at least two openings OA existing in the area of the touch electrodes TE, when seen from above, thereby improving the light-emitting efficiency of the display panel DISP.

As illustrated in FIG. 10 and FIG. 11, a black matrix BM may be arranged on the display panel DISP, and a color filter CF may be additionally arranged thereon.

The position of the black matrix BM may correspond to the position of the electrode metal EM of the touch electrodes TE.

The position of multiple color filters CF corresponds to the position of multiple touch electrodes TE or the position of the electrode metal EM constituting the multiple touch electrodes TE.

As described above, multiple color filters CF may be positioned so as to correspond to multiple open areas OA, thereby improving the light-emitting performance of the display panel DISP.

The relationship between vertical positions of the multiple color filters CF and the multiple touch electrodes TE is as follows:

As illustrated in FIG. 10, multiple color filters CF and black matrices BM may be positioned on multiple touch electrodes TE.

In this case, the multiple color filters CF and black matrices BM may be positioned on an overcoat layer OC arranged on the multiple touch electrodes TE. The overcoat layer OC may be identical to the touch protective film PAC of FIG. 9 or different therefrom.

As illustrated in FIG. 11, multiple color filters CF and black matrices BM may be positioned below multiple touch electrodes TE.

In this case, the multiple touch electrodes TE may be positioned on an overcoat layer OC on the multiple color filters CF and black matrices BM. The overcoat layer OC may be identical to the touch buffer film T-BUF or the touch insulating film ILD of FIG. 9, or different therefrom.

In connection with the above-described touch sensor structure for touch sensing, a difference in resistance between multiple touch routing wires TL connected to respective touch electrode lines TEL may result in a deviation of touch sensing signals received through the touch routing wires TL. Such a deviation of touch sensing signals may degrade the accuracy of touch sensing.

Example embodiments of the present disclosure seek to provide a structure that compensates for the difference in resistance between multiple touch routing wires TL connected to respective touch electrode lines TEL, thereby reducing the deviation of touch sensing signals and improving the performance of touch sensing.

Figure 12:
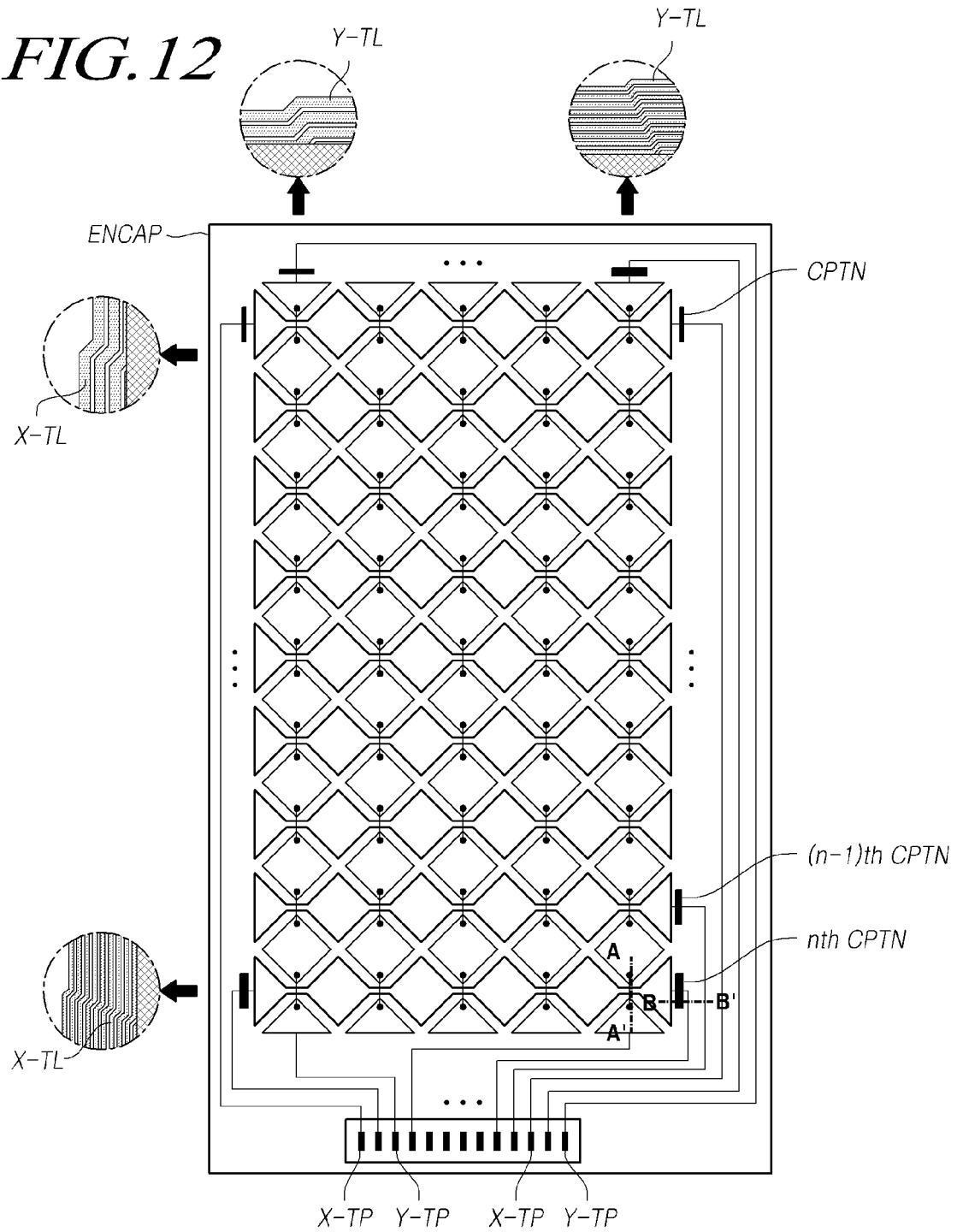
FIG. 12 illustrates an exemplary structure for compensating for a load on a touch routing wire arranged on a display panel according to example embodiments of the present disclosure.

FIG. 12 illustrates an exemplary structure for compensating for a load on touch routing wires TL arranged on a display panel DISP according to example embodiments of the present disclosure.

Referring to FIG. 12, multiple X-touch electrode lines X-TEL and multiple Y-touch electrode lines Y-TEL are arranged on the encapsulation portion ENCAP. In addition, multiple X-touch routing wires X-TL connected to the multiple X-touch electrode lines X-TEL, respectively, and multiple Y-touch routing wires Y-TL connected to the multiple Y-touch electrode lines Y-TEL, respectively, may be arranged thereon.

The X-touch routing wires X-TL and the Y-touch routing wires Y-TL, which connect between the touch electrodes TE and the touch pad TP, may have widths that are not constant.

For example, at least one of the multiple touch routing wires TL arranged on the display panel DISP may be configured such that the width of a part thereof adjacent to the touch pad TP is smaller than the width of a part thereof arranged far from the touch pad TP.

That is, since a large number of touch routing wires TL are arranged in the area adjacent to the touch pad TP, the touch routing wires TL arranged in the corresponding area may have relatively small widths.

In addition, since a small number of touch routing wires TL are arranged in the area far from the touch pad TP, the touch routing wires TL arranged in the corresponding area may have relatively large widths.

The widths of the touch routing wires TL may increase gradually or in a stepwise manner in proportion to the distance from the touch pad TP.

As such, the touch routing wires TL may include parts, the width of which increases in proportion to the distance from the touch pad TP, thereby decreasing the resistance of touch routing wires TL connected to touch electrodes TE arranged far from the touch pad TP.

Accordingly, the difference in resistance resulting from the difference in length of the touch routing wires TL can be compensated for.

Furthermore, compensation patterns CPTN may be arranged between touch electrodes TE and touch routing wires TL so as to form capacitances such that the difference in capacitance between multiple touch routing wires TL is compensated for.

In order to compensate for such capacitances between the touch routing wires TL, multiple compensation patterns CPTN may be arranged to form capacitances between touch electrodes TE and touch routing wires TL in the active area AA of the display panel DISP.

The multiple compensation patterns CPTN may be connected between touch electrodes TE and touch routing wires TL and, if necessary, parts of the touch routing wires TL may be arranged between the touch electrodes TE and the compensation patterns CPTN. That is, the compensation patterns CPTN may be electrically connected to respective touch routing wires TL.

The multiple compensation patterns CPTN may form different magnitudes of capacitances, respectively, in order to compensate for the difference in capacitance between the touch routing wires TL. Accordingly, the area of the multiple compensation patterns CPTN may not be constant.

For example, when a touch routing wire TL connected to a compensation pattern CPTN has a small length, that is, when the capacitance formed by the touch routing wire TL is small, the area of the compensation pattern CPTN may be relatively large. In addition, when a touch routing wire TL connected to a compensation pattern CPTN has a large length, that is, when the capacitance formed by the touch routing wire TL is large, the area of the compensation pattern CPTN may be relatively small.

That is, the magnitude of capacitance formed by a compensation pattern CPTN or the area of the compensation pattern CPTN may be inversely proportional to the length of the touch routing wire TL, and the area of the $(n-1)^{th}$ compensation pattern CPTN may be smaller than the area of the $n^{th}$ compensation pattern CPTN as in the example illustrated in FIG. 12.

Such arrangement of compensation patterns CPTN may compensate for the difference in capacitance between the touch routing wires TL.

Figure 13:
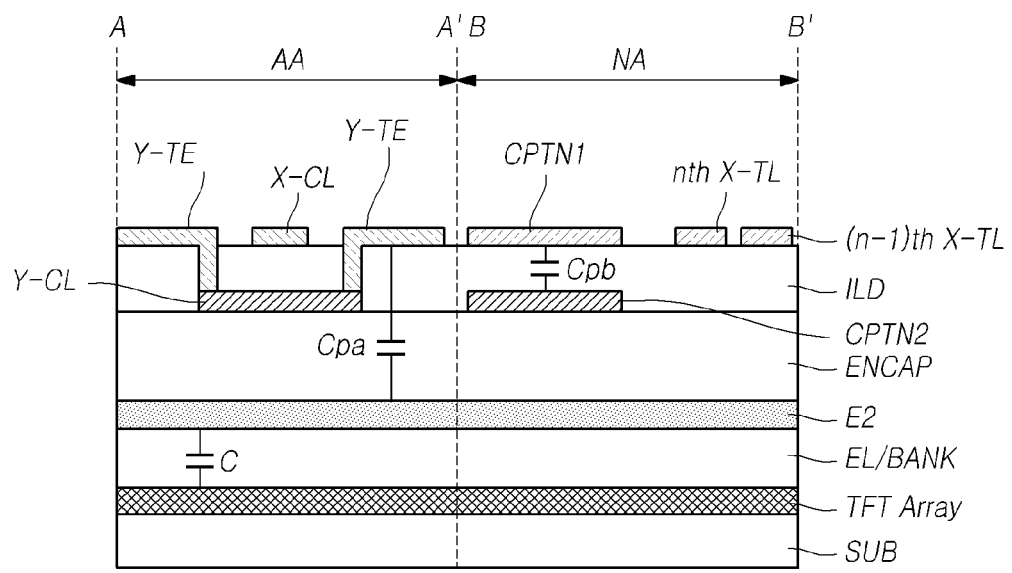
FIG. 13 illustrates an exemplary sectional structure of part A-A' and part B-B' illustrated in FIG. 12 according to example embodiments of the present disclosure.

FIG. 13 illustrates an exemplary sectional structure of part A-A' and part B-B' illustrated in FIG. 12.

Referring to FIG. 13, a thin film transistor (TFT) array on which a circuit element for display driving, a first electrode E1, and the like are arranged may be arranged on the substrate SUB. A light-emitting layer EL, a bank BANK, and a second electrode E2 may be arranged on the TFT array.

An encapsulation portion ENCAP may be arranged on the second electrode E2, and a touch sensor metal for touch sensing may be arranged on the encapsulation portion ENCAP.

A connection pattern for connecting touch electrodes TE may be arranged in the active area AA on the encapsulation portion ENCAP. For example, a Y-touch electrode connection wire Y-CL may be arranged so as to connect Y-touch electrodes Y-TE to each other.

A touch insulating film ILD may be arranged on the Y-touch electrode connection wire Y-CL. A Y-touch electrode Y-TE, an X-touch electrode X-TE, an X-touch electrode connection wire X-CL, and the like may be arranged on the touch insulating film ILD.

Multiple touch routing wires TL may be arranged in the nonactive area NA on the encapsulation portion ENCAP, and a compensation pattern CPTN may be arranged between the touch electrodes TE and the touch routing wires TL so as to compensate for the difference in capacitance between the touch routing wires TL.

For example, the compensation pattern CPTN may include a first compensation pattern CPTN1 and a second compensation pattern CPTN2.

The first compensation pattern CPTN1 may be arranged on the touch insulating film ILD and arranged on the same layer with the touch electrodes TE and the touch routing wires TL.

The first compensation pattern CPTN1 may be electrically connected to each of the multiple touch routing wires TL and, for example, may be electrically connected between the touch electrodes TE and the touch routing wires TL.

The second compensation pattern CPTN2 may be arranged on the encapsulation portion ENCAP and arranged on the same layer with a connection pattern that connects touch electrodes TE through a contact hole.

Alternatively, the second compensation pattern CPTN2 may be arranged on a different layer from the connection pattern.

For example, one touch insulating film ILD may be arranged on the connection pattern that connects touch electrodes TE, and the second compensation pattern CPTN2 may be arranged on the touch insulating film ILD. Another touch insulating film ILD may be arranged on the second compensation pattern CPTN2, and touch electrodes TE and a first compensation pattern CPTN1 may be arranged on the touch insulating film ILD.

That is, the distance between the first compensation pattern CPTN1 and the second compensation pattern CPTN2 may be reduced such that the capacitance is compensated for by the compensation pattern CPTN having a small area.

The second compensation pattern CPTN2 may be arranged so as to correspond to the first compensation pattern CPTN1 arranged on the touch insulating film ILD.

A constant voltage that has a potential difference from the voltage applied to the first compensation pattern CPTN1 may be applied to the second compensation pattern CPTN2, and, for example, the ground voltage to which the display panel DISP is grounded may be applied thereto.

Accordingly, the first compensation pattern CPTN1 and the second compensation pattern CPTN2 may form a capacitance.

The area of the first compensation pattern CPTN1 and the area of the second compensation pattern CPTN2 may differ depending on the length of the touch routing wire TL electrically connected to the first compensation pattern CPTN1.

For example, when the length of the touch routing wire TL connected to the first compensation pattern CPTN1 is large, the capacitance formed by the touch routing wire TL is large; accordingly, the area of the first compensation pattern CPTN1 connected to the corresponding touch routing wire TL may be relatively small.

In addition, when the length of the touch routing wire TL connected to the first compensation pattern CPTN1 is small, the capacitance formed by the touch routing wire TL is small; accordingly, the area of the first compensation pattern CPTN1 connected to the corresponding touch routing wire TL may be relatively large.

As such, the compensation pattern CPTN connected to the touch routing wires TL is arranged to have a different area according to the magnitude of capacitance formed by the touch routing wires TL such that the deviation in capacitance between the touch routing wires TL can be compensated for by the compensation pattern CPTN.

Accordingly, the accuracy of touch sensing can be improved by reducing the deviation of touch sensing signals due to the deviation in capacitance between the touch routing wires TL.

Since electrodes for display driving and the like are arranged beneath the touch sensor metal for touch sensing, the parasitic capacitance formed between the touch sensor metal and the electrodes for display driving may cause noise in touch sensing signals.

For example, a capacitance C may be formed between the second electrode E2 and the TFT array on which various signal lines are arranged. In addition, a parasitic capacitance Cpa may be formed between the second electrode E2 and the touch electrodes TE.

The voltage of the second electrode E2 may vibrate due to signals, voltages, and the like supplied to the TFT array, and this may cause noise in touch sensing signals received from the touch electrodes TE that form a parasitic capacitance Cpa with the second electrode E2.

In order to reduce the noise-induced influence and improve the sensitivity of touch sensing signals, the intensity of touch driving signals applied to the touch electrodes TE may be increased. That is, increasing the intensity of touch driving signals may increase the intensity of touch sensing signals such that touch sensing is performed with reduced influence of noise.

Alternatively, influence of noise may be reduced by sensing touches in a differential sensing type, that is, by sensing a signal corresponding to the difference between touch sensing signals received from adjacent touch electrodes TE.

That is, the difference between a touch sensing signal received from a touch electrode line TEL and a touch sensing signal received from another touch electrode line TEL may be sensed such that noise is removed from the touch sensing signals received from the touch electrode lines TEL. In addition, touches can be detected on the basis of the difference between touch sensing signals received from adjacent touch electrode lines TEL.

The touch sensing in the differential sensing type may be performed on the basis of a difference between touch sensing signals received not only from adjacent touch electrode lines TEL, but also from touch electrode lines TEL that are far from each other, in view of the intensity of the touch sensing signals and the amount of noise.

That is, touch sensing signals received from adjacent touch electrode lines TEL may have a large amount of common noise, but the difference between the touch sensing signals may be small; accordingly, the magnitude of signals detected through differential sensing may be small.

Accordingly, differential sensing may be performed on the basis of the difference between touch sensing signals received from adjacent touch electrode lines TEL and, if necessary, may be performed on the basis of the difference between touch sensing signals received from touch electrode lines TEL that are not adjacent.

As such, touches may be sensed in a differential sensing type so as to reduce the influence of noise resulting from electrodes for display driving.

Figure 14:
FIG. 14 illustrates an exemplary noise source of touch sensing signals detected through a touch sensor metal in the structure illustrated in FIG. 13 according to example embodiments of the present disclosure.

FIG. 14 illustrates an exemplary noise source of touch sensing signals detected through the touch sensor metal in the structure illustrated in FIG. 13.

Referring to FIG. 13 and FIG. 14, touch electrodes TE form a parasitic capacitance Cpa with the second electrode E2 arranged beneath the encapsulation portion ENCAP, and the noise source regarding the touch electrodes TE may accordingly be the second electrode E2. In addition, the touch routing wires TL may also form a parasitic capacitance with the second electrode E2, and the noise source of the touch routing wires TL may be identical to the noise source of the touch electrodes TE. That is, the second electrode E2 to which the base voltage VSS is applied may be the noise source.

In contrast, the first compensation pattern CPTN1 electrically connected to the touch routing wires TL forms a capacitance Cpb with the second compensation pattern CPTN2 arranged beneath the touch insulating film ILD.

Accordingly, in the path of detection of touch sensing signals, which includes the touch electrodes TE, the first compensation pattern CPTN1, and the touch routing wires TL, the noise source of the first compensation pattern CPTN1 is the second compensation pattern CPTN2. That is, the second compensation pattern CPTN2 to which the ground voltage is applied may be the noise source.

In addition, since the noise source regarding the touch electrodes TE and the touch routing wires TL is the second electrode E2, noise of touch sensing signals detected through adjacent touch routing wires TL as a result of the difference in the noise source may incur a difference corresponding to the capacitance formed by the first compensation pattern CPTN1.

Accordingly, since a small amount of noise is removed through differential sensing, the performance of touch sensing through differential sensing may be degraded.

Example embodiments of the present disclosure provide a constant noise source related to the touch sensor metal in a structure in which a compensation pattern CPTN is arranged to compensate for the capacitance deviation of touch routing wires TL, thereby improving the performance of touch sensing in the differential sensing type.

Figure 15:
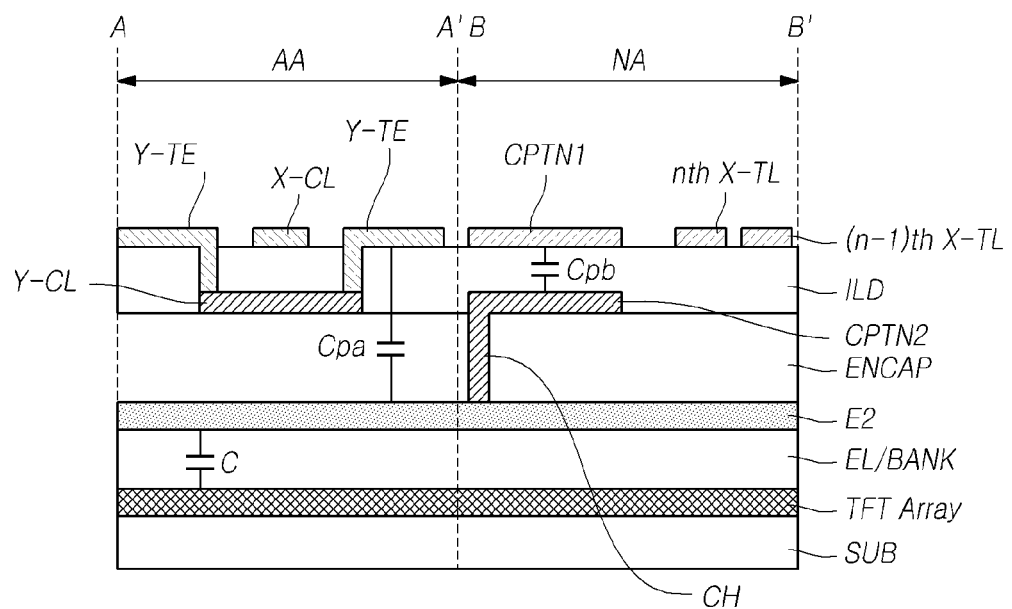
FIG. 15 illustrates another exemplary sectional structure of part A-A' and part B-B' illustrated in FIG. 12 according to example embodiments of the present disclosure.

FIG. 15 illustrates another exemplary sectional structure of part A-A' and part B-B' illustrated in FIG. 12.

Referring to FIG. 15, a TFT array, a light-emitting layer EL, a bank BANK, a second electrode E2, and the like are arranged on a substrate SUB. An encapsulation portion ENCAP may be arranged on the second electrode E2, and a touch electrode connection wire CL and a second compensation pattern CPTN2 may be arranged on the encapsulation portion ENCAP.

A touch insulating film ILD may be arranged on the touch electrode connection wire CL and the second compensation pattern CPTN2, and a touch electrode TE, a first compensation pattern CPTN1, a touch routing wire TL, and the like may be arranged on the touch insulating film ILD.

The encapsulation portion ENCAP may include a contact hole CH in the nonactive area NA, and the second compensation pattern CPTN2 arranged on the encapsulation portion ENCAP may be electrically connected to the second electrode E2 through the contact hole CH.

Since the second compensation pattern CPTN2 is electrically connected to the second electrode E2, the voltage applied to the second electrode E2, for example, the base voltage VSS, may be applied to the second compensation pattern CPTN2.

Even if the voltage applied to the second electrode E2 may be applied to the second compensation pattern CPTN2, the same may form a capacitance with the first compensation pattern CPTN1 such that the capacitance deviation of the touch routing wire TL can be compensated for.

Since the voltage applied to the second electrode E2 is applied to the second compensation pattern CPTN2 that forms a parasitic capacitance Cpb with the first compensation pattern CPTN1, the noise source regarding the first compensation pattern CPTN1 is the second electrode E2.

That is, since the touch electrode TE, the first compensation pattern CPTN1, and the touch routing wire TL have the same noise source, which is the second electrode E2, the amount of common noise in touch sensing signals detected from the touch electrode may increase.

Accordingly, the amount of noise removed from touch sensing signals detected in the differential sensing type increases, thereby improving the performance of touch sensing based on touch sensing signals detected in the differential sensing type.

In addition, instead of forming a contact hole CH in the encapsulation portion ENCAP, the same voltage as that applied to the second electrode E2 may be applied to the second compensation pattern CPTN2 from the outside such that the noise source regarding the first compensation pattern CPTN1 and the noise source regarding another touch sensor metal become identical.

Figure 16:
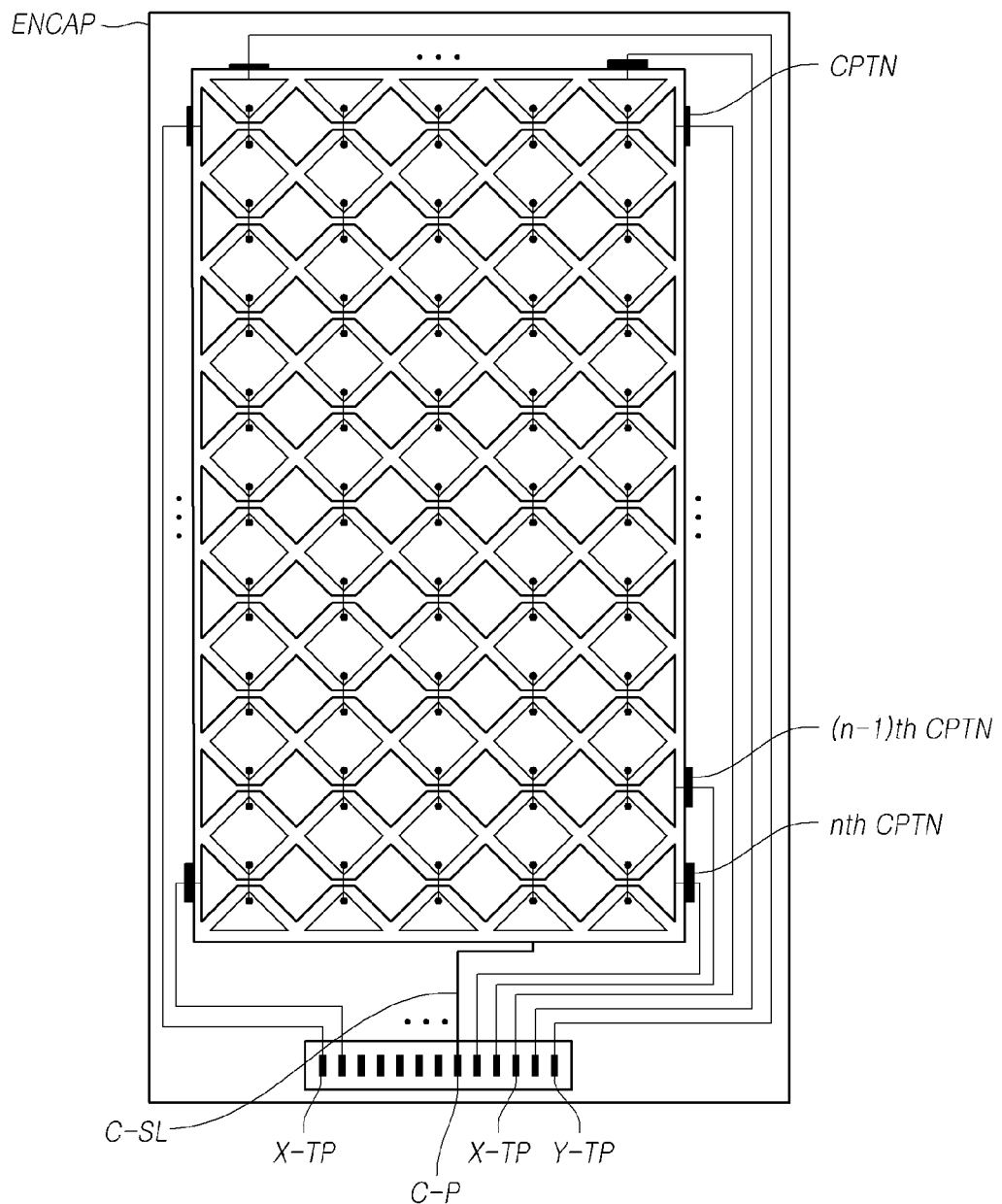
FIG. 16 illustrates an exemplary structure in which a signal wire for noise compensation is arranged on the display panel illustrated in FIG. 12 according to example embodiments of the present disclosure.

FIG. 16 illustrates an exemplary structure in which a signal wire for noise compensation is arranged on the display panel DISP illustrated in FIG. 12.

Referring to FIG. 16, multiple X-touch electrode lines X-TEL and Y-touch electrode lines Y-TEL are arranged on the encapsulation portion ENCAP. In addition, multiple X-touch routing wires X-TL and Y-touch routing wires Y-TL may be arranged.

In addition, multiple compensation patterns CPTN may be arranged, which include a first compensation pattern CPTN1 electrically connected to each touch routing wire TL and a second compensation pattern CPTN2 arranged to correspond to the first compensation pattern CPTN1.

The area of each compensation pattern CPTN may vary depending on the magnitude of capacitance formed by the touch routing wire TL connected to the first compensation pattern CPTN1.

A compensation pattern signal line C-SL may be arranged on the encapsulation portion ENCAP and electrically connected to the second compensation pattern CPTN2 of the compensation patterns CPTN.

The compensation pattern signal line C-SL may be arranged on the same layer with the second compensation pattern CPTN2 on the encapsulation portion ENCAP and electrically connected to the second compensation pattern CPTN2 arranged on the encapsulation portion ENCAP. In addition, for example, the compensation pattern signal line C-SL may be arranged so as to surround the outer periphery of the active area AA.

The compensation pattern signal line C-SL may be electrically connected to the compensation pattern pad C-P and may supply a specific voltage, which is supplied through the compensation pattern pad C-P, to the second compensation pattern CPTN2.

The voltage supplied through the compensation pattern signal line C-SL may be identical to the voltage applied to the second electrode E2 arranged beneath the encapsulation portion ENCAP.

Accordingly, the same voltage as that applied to the second electrode E2 is applied to the second compensation pattern CPTN2 through the compensation pattern signal line C-SL such that the noise source regarding the first compensation pattern CPTN1 and the noise source regarding the touch electrodes TE and the touch routing wires TL become identical.

By supplying the same voltage as that applied to the second electrode E2 to the second compensation pattern CPTN2 from the outside in this manner, the noise source on the path of detection of touch sensing signals becomes constant, thereby increasing the amount of common noise and improving the performance of touch sensing in the differential sensing type.

FIG. 17 illustrates an exemplary noise source of touch sensing signals detected through the touch sensor metal in the structure illustrated in FIG. 15 and FIG. 16.

Referring to FIG. 17, the second compensation pattern CPTN2 arranged on the encapsulation portion ENCAP is electrically connected to the second electrode E2 through the contact hole CH formed in the encapsulation portion ENCAP, or receives the same voltage from the outside as that applied to the second electrode E2 such that the noise source regarding the first compensation pattern CPTN1 is the second electrode E2.

Accordingly, the touch electrodes TE, the compensation patterns CPTN, and the touch routing wires TL have the same noise source, thereby increasing the amount of common noise in touch sensing signals received from at least two touch routing wires TL.

In addition, touch sensing signals are detected in the differential sensing type such that common noise is removed, thereby increasing the signal-to-noise ratio of detected touch sensing signals and accordingly improving the performance of touch sensing.

Figure 18A:
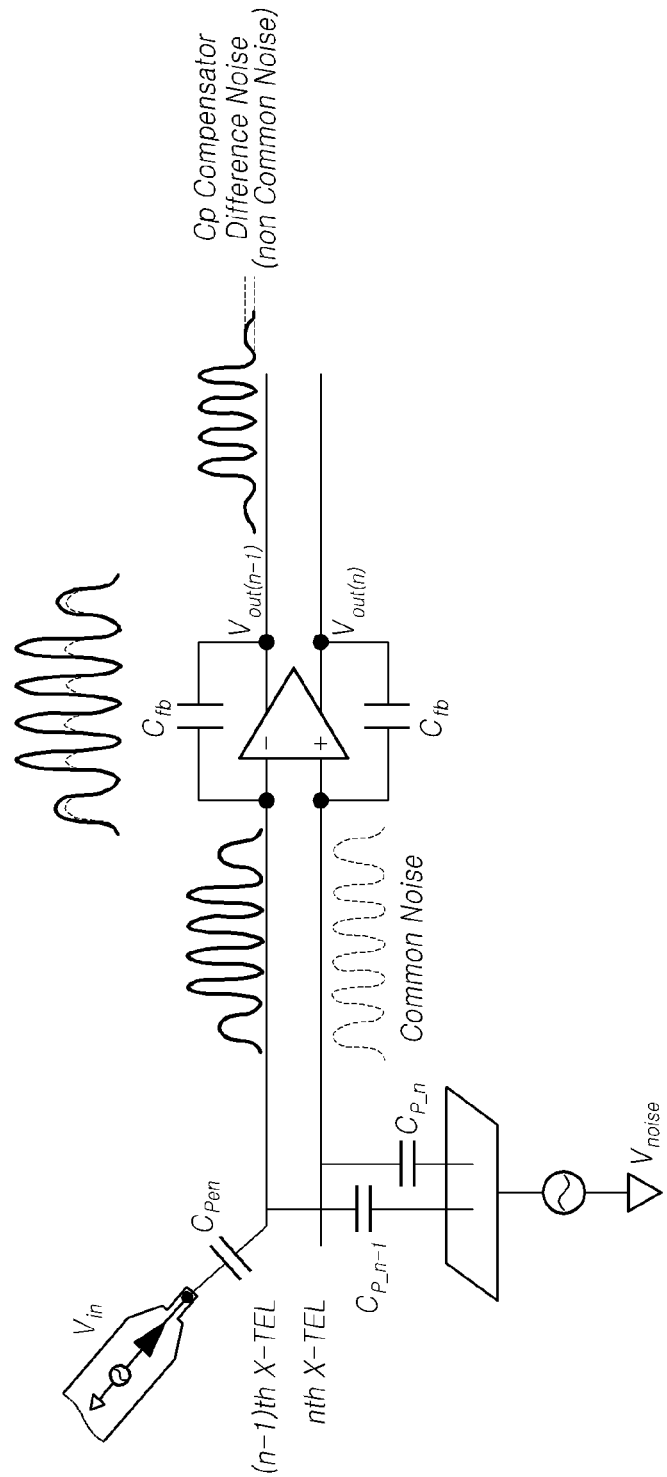
FIG. 18A and FIG. 18B illustrate exemplary touch sensing signals detected through differential sensing in the structure illustrated in FIG. 13 and in the structure illustrated in FIG. 15 and FIG. 16, respectively according to example embodiments of the present disclosure.
Figure 18B:
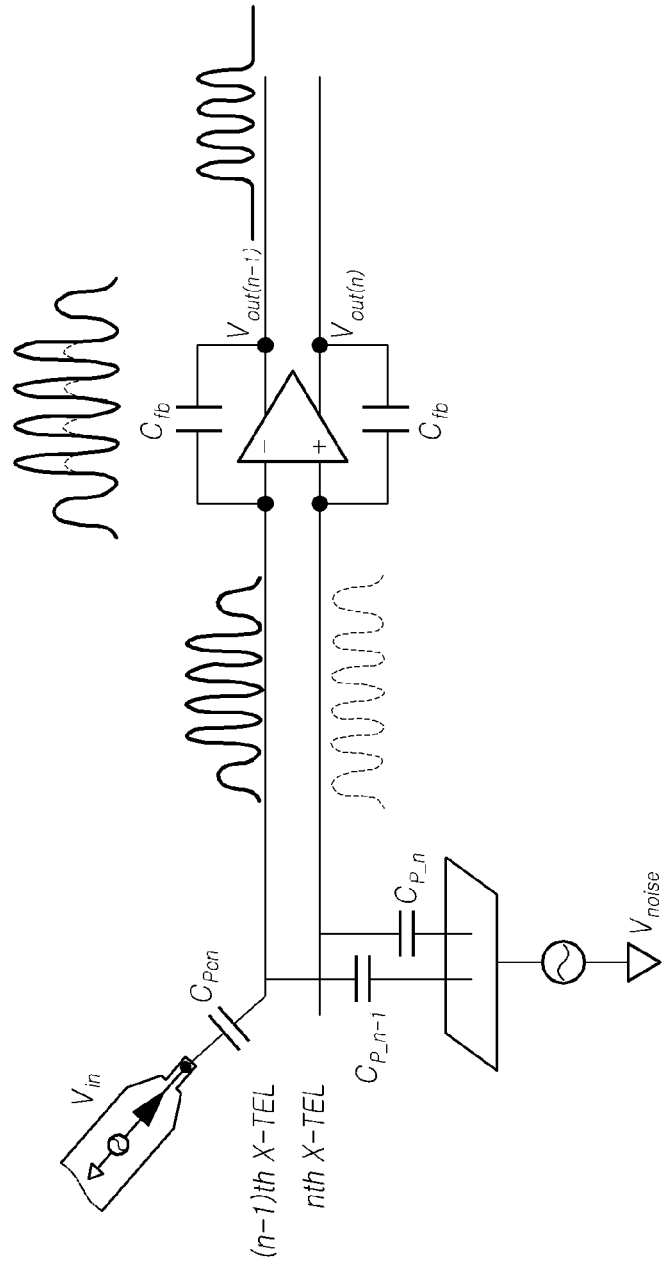

FIG. 18A and FIG. 18B illustrate exemplary touch sensing signals detected through differential sensing in the structure illustrated in FIG. 13 and in the structure illustrated in FIG. 15 and FIG. 16, respectively.

Referring to FIG. 18A and FIG. 18B, when touch sensing signals are detected in the differential sensing type, touch sensing signals received from the $(n-1)^{th}$ X-touch electrode line X-TEL and the $n^{th}$ X-touch electrode line X-TEL, for example, may be input to a differential amplifier. The differential amplifier may output a signal corresponding to the difference between the touch sensing signal input to the (+) input end and the touch sensing signal input to the (−) input end. As mentioned above, if necessary, touch sensing signals received from X-touch electrode lines X-TEL that are not adjacent may undergo differential sensing, thereby increasing the intensity of signals output through the differential amplifier.

In an exemplary case of differentially sensing a pen touch, signals output through differential sensing may be defined as below:

$$Vout(n-1) = \frac{Cpen\_n-1 - Cpen\_n}{Cfb} Vin + \frac{Cp\_n-1 - Cp\_n}{Cfb} Vnoise$$

wherein Vin denotes the output voltage of the pen, and Vnoise denotes the voltage of the noise source. In addition, Cpen denotes the magnitude of capacitance between the pen and the touch electrode line TEL, and Cp denotes the parasitic capacitance between the electrode that serves as the noise source and the touch electrode line TEL.

Accordingly, the noise source is the same, the amount of removed noise is inversely proportional to the difference between Cp_n-1 and Cp_n, and the intensity of signals acquired through differential sensing may accordingly increase.

As in CASE 1 of FIG. 18A, in a structure in which a compensation pattern CPTN is arranged so as to compensate for the capacitance deviation of the touch rouging wire TL, the noise source of the compensation pattern CPTN may differ from the noise source of the touch electrode TE or that of the touch routing wire TL.

Accordingly, there is a small amount of common noise between the touch sensing signal received from the $(n-1)^{th}$ X-touch electrode line X-TEL and the touch sensing signal received from the $n^{th}$ X-touch electrode line X-TEL, and a small amount of noise may be consequently removed from the signals output through the differential amplifier.

In contrast, as in CASE 2 of FIG. 18B in which a compensation pattern CPTN is arranged so as to compensate for the capacitance deviation of the touch routing wire TL, and in which the same voltage as that applied to the second electrode E2 is applied to the second compensation pattern CPTN2, the noise source of the compensation patterns CPTN may be identical to the noise source of the touch electrodes TE or that of the touch routing wires TL.

Accordingly, there may be an increased amount of common noise between the touch sensing signal received from the $(n-1)^{th}$ X-touch electrode line X-TEL and the touch sensing signal received from the $n^{th}$ X-touch electrode line X-TEL.

When the differential amplifier outputs a signal corresponding to the difference between the touch sensing signal received from the $(n-1)^{th}$ X-touch electrode line X-TEL and the touch sensing signal received from the $n^{th}$ X-touch electrode line X-TEL, common noise may be removed, thereby increasing the signal-to-noise ratio of signals output by the differential amplifier.

This reduces the influence of noise resulting from the electrodes for display driving in connection with touch sensing through touch electrodes TE arranged on the display panel DISP, thereby improving the sensing performance.

Although it is assumed for convenience of description that the pen signal has a sine waveform, the pen signal may also have a square waveform, a triangular waveform, or various other waveforms.

In order to reduce the noise itself resulting from the electrodes for display driving, an electrode for blocking display noise may be arranged beneath the second electrode E2.

That is, noise of the second electrode E2 which is arranged closest to the touch electrodes TE may be reduced, thereby preventing noise of the touch electrodes TE from increasing.

Figure 19:
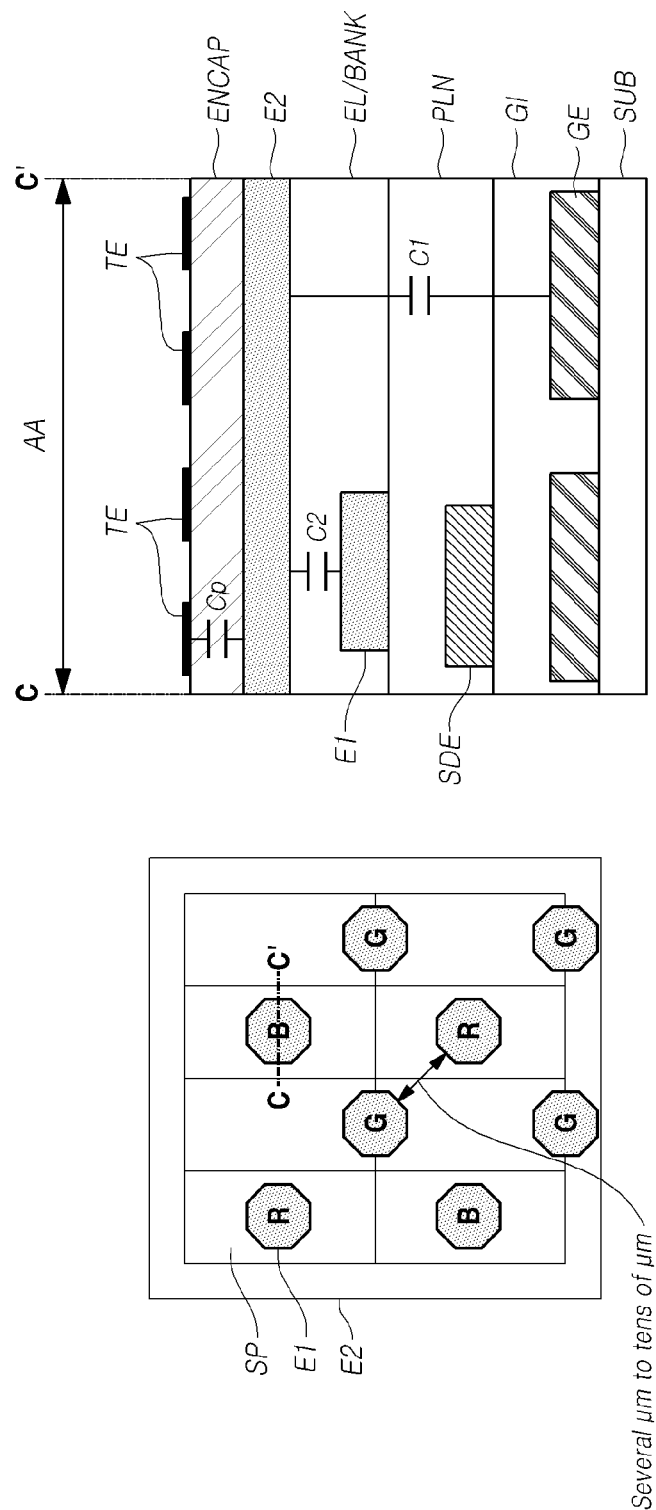
FIG. 19 illustrates an exemplary structure in which a touch electrode and a display electrode are arranged in an active area of a display panel according to example embodiments of the present disclosure.

FIG. 19 illustrates an exemplary structure in which a touch electrode TE and a display electrode are arranged in an active area AA of a display panel DISP according to example embodiments of the present disclosure.

Referring to FIG. 19, multiple first electrodes E1 constituting respective subpixels SP may be partially deposited and arranged in the active area AA of the display panel DISP. In addition, a second electrode E2 may be deposited and arranged on the enter surface of the active area AA.

Electrodes constituting a signal line for display driving may be arranged beneath the first electrodes E1, and touch electrodes TE for touch sensing may be arranged above the second electrode E2.

For example, a gate electrode GE is arranged on the substrate SUB, and a gate insulating layer GI is arranged on the gate electrode GE. The gate electrode GE may constitute a gate node of a transistor that drives each subpixel SP, or may constitute a signal line.

A source drain electrode SDE may be arranged on the gate insulating layer GI, and a planarization film PLN may be arranged on the source drain electrode SDE. The source drain electrode SDE may constitute the source electrode or drain electrode of a transistor that drives each subpixel SP, or may constitute a signal line.

Assuming an exemplary case in which the gate electrode GE is used as a signal line, a capacitance C1 may be formed between the gate electrode GE and the second electrode E2 as various signals (for example, a synchronization signal, a clock signal, and the like) are applied to the gate electrode GE. Accordingly, signals applied through the gate electrode GE may be coupled with the second electrode E2, thereby functioning as noise.

In addition, a capacitance C2 may be formed between the first electrode E1 and the second electrode E2, to which a voltage is applied through the signal line, and the second electrode E2 may accordingly generate noise through coupling with a signal applied to the first electrode E1.

As such, noise resulting from the signal line or electrode positioned beneath the second electrode E2 may be coupled with the second electrode E2; a parasitic capacitance Cp may be formed between the second electrode E2 and the touch electrode TE; and the noise coupled with the second electrode E2 may accordingly function as noise with regard to the touch electrode TE positioned above the second electrode E2.

Example embodiments of the present disclosure provide a scheme for reducing noise of the second electrode E2, which is coupled by the signal line or electrode positioned below the second electrode E2, such that noise of the touch electrode TE can be prevented from increasing.

Figure 20:
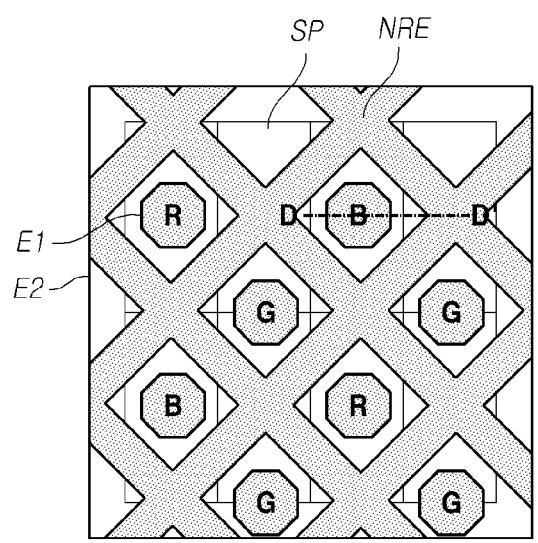
FIG. 20 illustrates an exemplary planar structure in which a noise reduction electrode is arranged in an active area of a display panel according to example embodiments of the present disclosure.

FIG. 20 illustrates an exemplary planar structure of an active area AA of a display panel 110 according to example embodiments of the present disclosure, and illustrates an exemplary structure in which a noise reduction electrode NRE capable of reducing noise coupled with the second electrode E2 is arranged.

Referring to FIG. 20, a first electrode E1 is partially deposited and arranged in the active area AA of the display panel DISP, and a second electrode E2 is deposited and arranged on the entire surface. A noise reduction electrode NRE may be arranged on the layer on which the first electrode E1 is arranged in an area in which the first electrode E1 is not arranged.

The noise reduction electrode NRE may be arranged with the same material as that of the first electrode E1, and may be arranged separately from the first electrode E1.

The noise reduction electrode NRE may be integrally formed and arranged as in the example illustrated in FIG. 20. Alternatively, multiple separate noise reduction electrodes NRE may be arranged.

That is, there is no restriction on the type of arrangement of the noise reduction electrode NRE, and the same may be arranged between the second electrode E2 and a gate electrode GE constituting a signal line or a source drain electrode SDE.

In addition, the noise reduction electrode NRE may be arranged on the layer on which the first electrode E1 is arranged in at least a part of the area in which the first electrode E1 is not arranged such that there is no need for a separate process for arranging the noise reduction electrode NRE.

A predetermined voltage may be applied to the noise reduction electrode NRE, and the noise coupled with the second electrode E2 may be reduced by such application of a predetermined voltage to the noise reduction electrode NRE.

Figure 21:
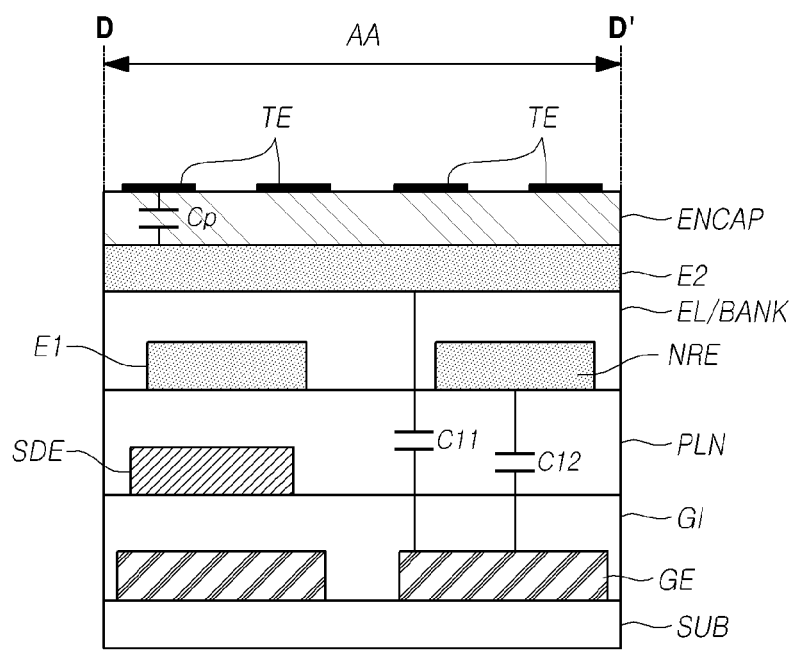
FIG. 21 to FIG. 23 illustrate exemplary sectional structures of part D-D' illustrated in FIG. 20 according to example embodiments of the present disclosure.
Figure 22:
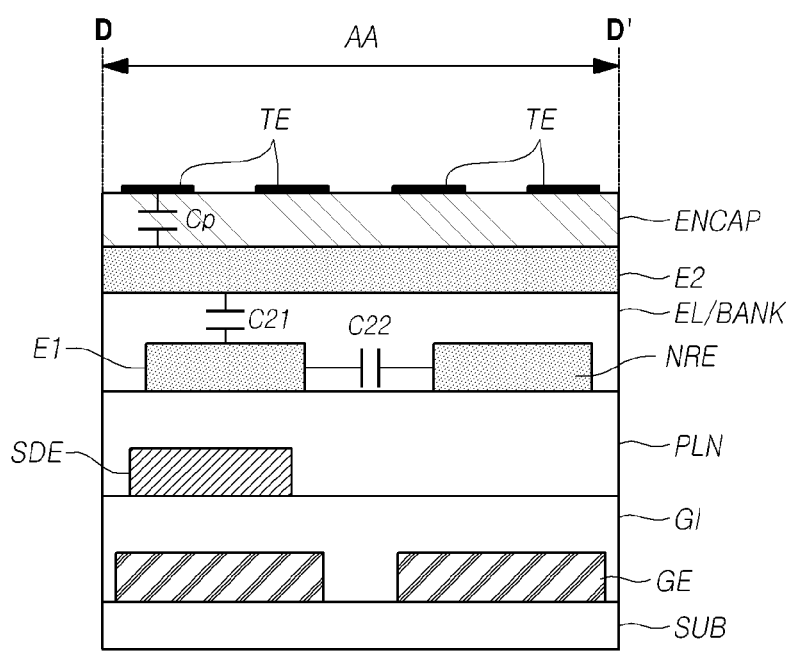
Figure 23:
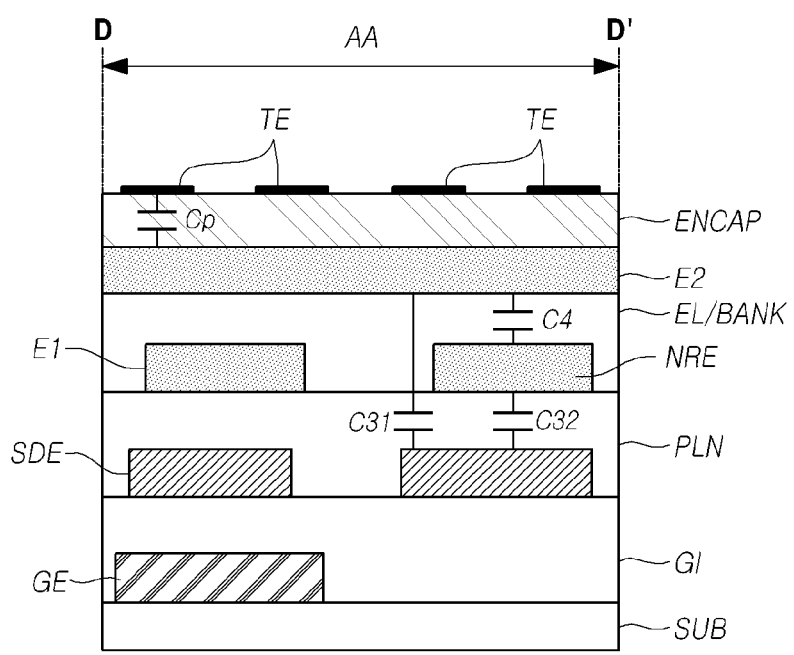

FIG. 21 to FIG. 23 illustrate exemplary sectional structures of part D-D' illustrated in FIG. 20, and illustrate a structure in which a noise reduction electrode NRE is arranged and examples of reduction of noise of the second electrode E2 as a result thereof.

Referring to FIG. 21, the display panel DISP according to example embodiments of the present disclosure has a gate electrode GE arranged on the substrate SUB, and has a gate insulating layer GI arranged on the gate electrode GE. The gate electrode GE may constitute a signal line to which various signals for display driving are applied.

A source drain electrode SDE and a planarization film PLN may be arranged on the gate insulating layer GI, and a first electrode E1 may be arranged on the planarization film PLN.

A noise reduction electrode NRE may be arranged on the planarization film PLN in at least a part of the area in which the first electrode E1 is not arranged. The noise reduction electrode NRE may be made of the same material as that of the first electrode E1, and may be arranged separately from the first electrode E1.

A second electrode E2 may be positioned on the first electrode E1 and on the noise reduction electrode NRE, and an encapsulation portion ENCAP and a touch electrode TE may be arranged on the second electrode E2. A light-emitting layer EL, a bank BANK, and the like may be arranged between the first electrode E1 and the second electrode E2.

As the noise reduction electrode NRE is arranged between the gate electrode GE constituting a signal line and the second electrode E2, a capacitance C12 may be formed between the gate electrode GE and the noise reduction electrode NRE.

Furthermore, a capacitance C11 may be formed between the gate electrode GE and the second electrode E2.

Since the capacitance C11 is formed between the gate electrode GE and the second electrode E2, and since the capacitance C12 is formed between the gate electrode GE and the noise reduction electrode NRE, the extent to which noise caused by the gate electrode GE is coupled with the second electrode E2 may be reduced.

That is, if a capacitance is solely formed between the gate electrode GE and the second electrode E2, noise caused by the gate electrode GE may be entirely coupled with the second electrode E2.

However, since the gate electrode GE has capacitances formed with the second electrode E2 and with the noise reduction electrode NRE, respectively, a part of noise caused by the gate electrode GE may be discharged through the noise reduction electrode NRE by means of voltage distribution.

This may reduce noise of the second electrode E2, which occurs while being coupled with a signal applied to the gate electrode GE.

In addition, as a result of reducing the noise of the second electrode E2, which is coupled with a signal applied to the gate electrode GE, noise of the touch electrode TE, which is coupled with noise of the second electrode E2, may be reduced accordingly.

As such, by reducing the noise coupled with the second electrode E2 which is positioned beneath the touch electrode TE, and which is adjacent to the touch electrode TE, noise of the touch electrode TE, which is coupled with the second electrode E2, is reduced, thereby improving the performance of touch sensing.

The noise reduction electrode NRE can reduce noise coupled not only by a signal line positioned beneath the second electrode E2, but also by an electrode.

Referring to FIG. 22, a noise reduction electrode NRE is arranged on the layer on which a first electrode E1 is arranged in the area in which the first electrode E1 is not arranged. The noise reduction electrode NRE may be arranged separately from the first electrode E1.

If a voltage, signal, or the like is applied to the first electrode E1 through a signal line, a capacitance C21 may be formed between the first electrode E1 and the second electrode E2. In addition, noise caused by the signal applied to the first electrode E1 may be coupled with the second electrode E2.

Since the first electrode E1 may form a capacitance C22 with the noise reduction electrode NRE, at least a part of noise of the first electrode E1 may be discharged through the noise reduction electrode NRE.

This reduces the extent to which noise of the first electrode E1 is coupled with the second electrode E2. Since the noise coupled with the second electrode E2 is reduced, noise of the touch electrode TE, which is coupled with the noise of the second electrode E2, may be reduced.

Although it is assumed in the above examples that the gate electrode GE is used as a signal line, any increase in noise of the touch electrode TE can also be prevented by arranging the noise reduction electrode NRE when the source drain electrode SDE is used as the signal line.

Referring to FIG. 23, a planarization film PLN is arranged on a source drain electrode SDE constituting a signal line, and a first electrode E1 and a noise reduction electrode NRE are arranged on the planarization film PLN.

As various signals are applied to the source drain electrode SDE, a capacitance C31 may be formed between the source drain electrode SDE and the second electrode E2. In addition, noise of the second electrode E2 may occur while being coupled with a signal applied to the source drain electrode SDE.

Since the noise reduction electrode NRE is arranged on the source drain electrode SDE, a capacitance C32 may be formed between the source drain electrode SDE and the noise reduction electrode NRE.

Accordingly, at least a part of the noise resulting from the signal applied to the source drain electrode SDE may be discharged through the noise reduction electrode NRE.

That is, since the source drain electrode SDE forms a capacitance C31 with the second electrode E2 and forms a capacitance C32 with the noise reduction electrode NRE, the noise resulting from the signal applied to the source drain electrode SDE may be discharged to the noise reduction electrode NRE through voltage distribution.

In addition, since a part of the noise resulting from the signal applied to the source drain electrode SDE is discharged, the noise coupled with the second electrode E2 may be reduced.

Accordingly, by reducing the extent to which the noise of the second electrode E2 is coupled with the touch electrode TE that forms a parasitic capacitance Cp with the second electrode E2, the noise of the touch electrode TE is prevented from increasing.

That is, according to example embodiments of the present disclosure, a noise reduction electrode NRE is arranged between the second electrode E2 and the signal line or electrode positioned beneath the second electrode E2 so as to reduce the noise coupled with the second electrode E2 by the signal line or the electrode.

In addition, by reducing the noise coupled with the second electrode E2, it is possible to prevent any increase in noise of the touch sensing signal caused by coupling of noise of the second electrode E2 with the touch electrode TE.

The noise coupled with the second electrode E2 may be reduced by arranging the noise reduction electrode NRE in this manner, but a capacitance C4 may be formed between the noise reduction electrode NRE and the second electrode E2 when a constant voltage is applied to the noise reduction electrode NRE.

Accordingly, according to example embodiments of the present disclosure, the same level of voltage as that applied to the second electrode E2 is applied to the noise reduction electrode NRE such that any increase in load caused by the noise reduction electrode NRE can be prevented, and noise coupled with the second electrode E2 can be minimized.

Figure 24:
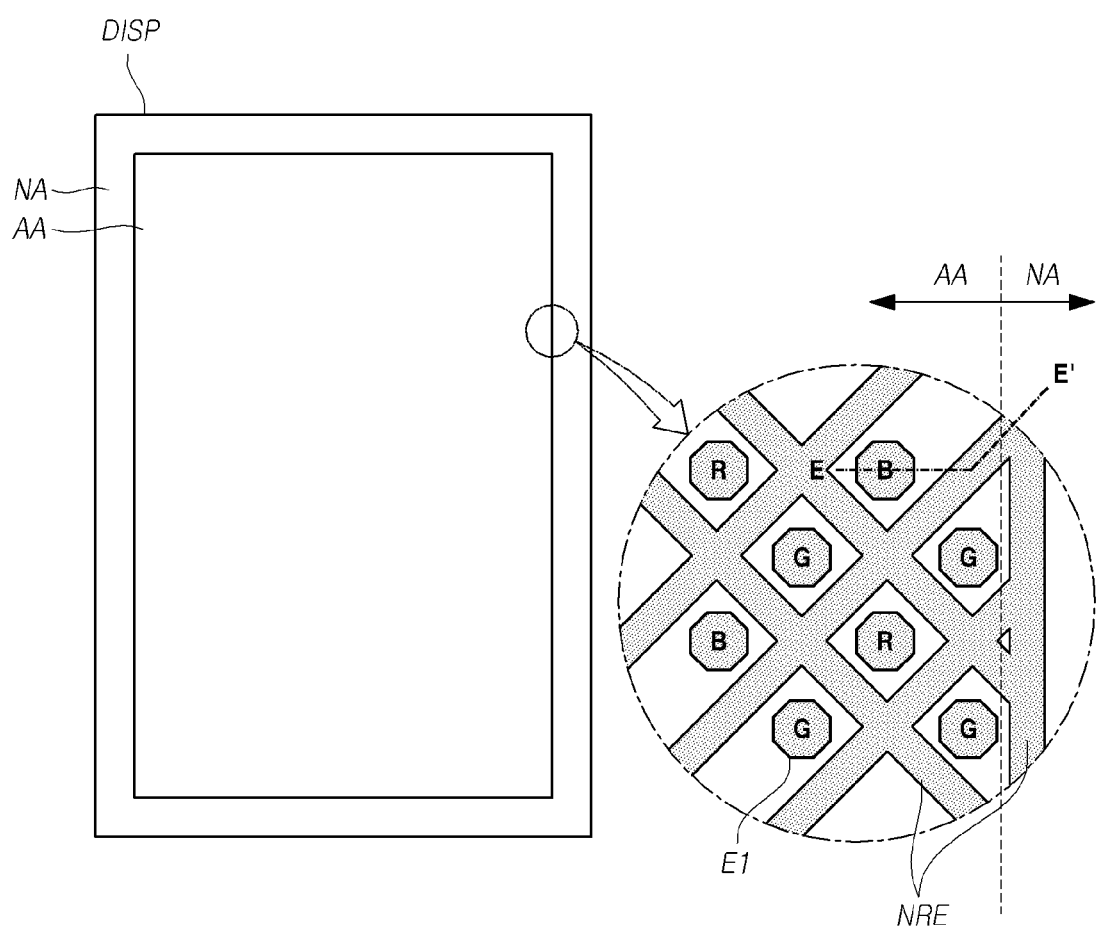
FIG. 24 illustrates an exemplary planar structure in which a noise reduction electrode is arranged in an active area and a nonactive area of a display panel according to example embodiments of the present disclosure.

FIG. 24 illustrates an exemplary planar structure in which a noise reduction electrode NRE is arranged in an active area AA and a non-active area NA of a display panel DISP according to example embodiments of the present disclosure.

Referring to FIG. 24, multiple first electrodes E1 may be arranged in the active area AA of the display panel DISP, and a noise reduction electrode NRE may be arranged in an area in which no first electrodes E1 are arranged.

A part of the noise reduction electrode NRE may be arranged in the nonactive area NA of the display panel DISP.

That is, by arranging the noise reduction electrode NRE in the active area AA, noise coupled with the second electrode E2 can be reduced. In addition, a part of the noise reduction electrode NRE is arranged in the nonactive area NA so as to provide a structure in which the same level of voltage as that applied to the second electrode E2 can be applied to the noise reduction electrode NRE.

Exemplary structures for applying the same voltage as that applied to the second electrode E2 through the noise reduction electrode NRE arranged in the nonactive area NA will be described with reference to FIG. 25 and FIG. 26.

Figure 25:
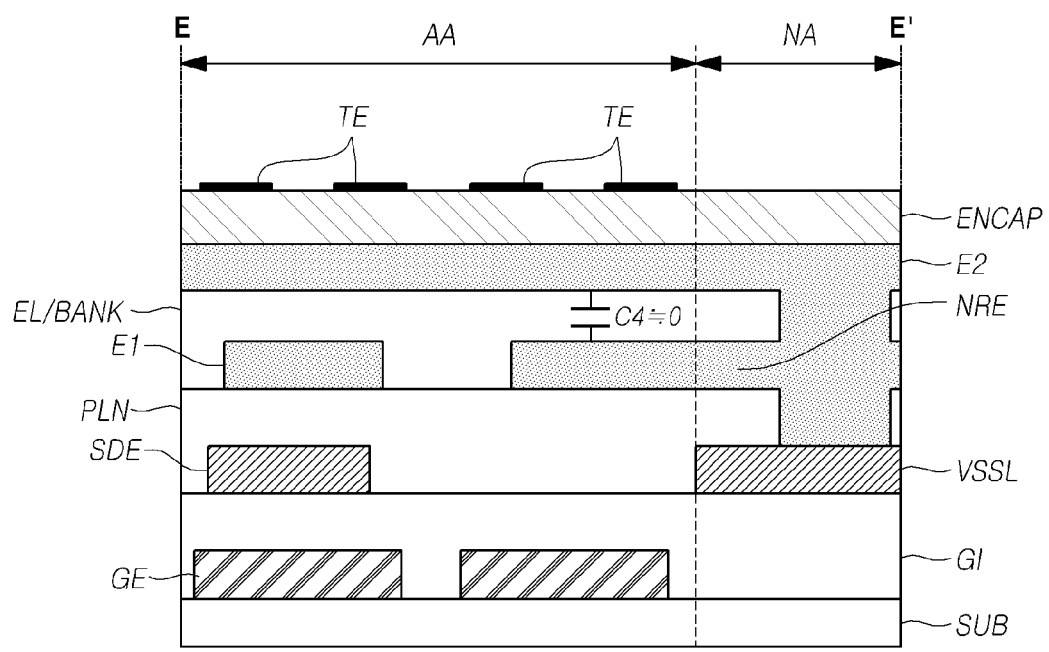
FIG. 25 and FIG. 26 illustrate exemplary sectional structures of part E-E' illustrated in FIG. 24 according to example embodiments of the present disclosure.
Figure 26:
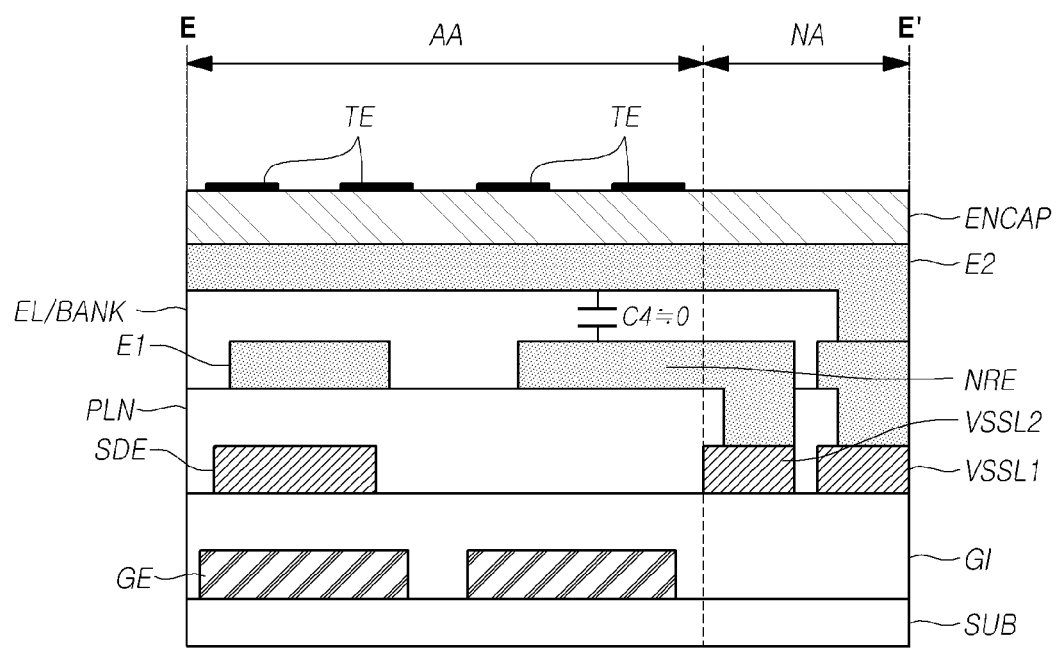

FIG. 25 and FIG. 26 illustrate exemplary sectional structures of part E-E' illustrated in FIG. 24.

Referring to FIG. 25, a gate electrode GE, a source drain electrode SDE, and the like are arranged in the active area AA of the display panel DISP. A first electrode E1 is arranged on the source drain electrode SDE, and a noise reduction electrode NRE is arranged in an area in which the first electrode E1 is not arranged.

A second electrode E2, a touch electrode TE, and the like may be arranged between the first electrode E1 and the noise reduction electrode NRE.

In the nonactive area NA of the display panel DISP, a signal line configured by the gate electrode GE or the source drain electrode SDG may be arranged. The signal line may include a base voltage line VSSL for applying a base voltage VSS to the second electrode E2.

The base voltage line VSSL may be configured by the source drain electrode SDE, for example.

The base voltage line VSSL may be connected to the second electrode E2 through a contact hole or the like so as to supply the base voltage VSS to the second electrode E2.

A part of the noise reduction electrode NRE arranged in the nonactive area NA may be connected to the second electrode E2 or to the base voltage line VSSL.

For example, the noise reduction electrode NRE may be connected to the second electrode E2 through a contact hole in the nonactive area NA. Alternatively, the noise reduction electrode NRE may be connected to the base voltage line VSSL through a contact hole in the nonactive area NA. Alternatively, the noise reduction electrode NRE may be connected to both the second electrode E2 and the base voltage line VSSL.

That is, a part of the noise reduction electrode NRE may be arranged in the nonactive area NA, and the noise reduction electrode NRE arranged in the nonactive area NA may be connected to the second electrode E2 and/or to the base voltage line VSSL for supplying the base voltage VSS to the second electrode E2.

Accordingly, the noise reduction electrode NRE may be arranged to be insulated from the second electrode E2 in the active area AA and may be arranged to be connected to the second electrode E2 in the nonactive area NA.

Such a structure ensures that the base voltage VSS applied to the second electrode E2 is applied to the noise reduction electrode NRE.

Such application of the same voltage as that applied to the second electrode E2 to the noise reduction electrode NRE guarantees that no capacitance C4 is formed between the noise reduction electrode NRE and the second electrode E2.

Since no capacitance is formed between the noise reduction electrode NRE and the second electrode E2, a load increase caused by the noise reduction electrode NRE can be prevented, and noise coupled with the second electrode E2 can be reduced.

Alternatively, the same level of voltage as that applied to the second electrode E2 may be applied to the noise reduction electrode NRE through a separate signal line arranged in the nonactive area NA.

Referring to FIG. 26, in the active area AA of the display panel DISP, a gate electrode GE, a source drain electrode SDE, and the like may be arranged on the substrate SUB, and a first electrode E1 and a noise reduction electrode NRE may be arranged on the source drain electrode SDE.

A second electrode E2, a touch electrode TE, and the like may be arranged on the first electrode E1 and on the noise reduction electrode NRE.

In the active area AA, the noise reduction electrode NRE may be arranged separately from the first electrode E1 and may be arranged to be insulated from the second electrode E2.

In the nonactive area NA of the display panel DISP, the second electrode E2 may be connected to the first base voltage line VSSL1 through a contact hole.

For example, the first base voltage line VSSL1 may be configured by the source drain electrode SDE. The second electrode E2 may be directly connected to the first base voltage line VSSL1 through a contact hole or may be connected through an electrode arranged on the same layer with the first electrode E1.

In the nonactive area NA of the display panel DISP, a second base voltage line VSSL2 may be arranged to be connected to the noise reduction electrode NRE.

The second base voltage line VSSL2 may be configured by the source drain electrode SDE, for example, and may be arranged separately from the first base voltage line VSSL1.

The noise reduction electrode NRE may be connected to the second base voltage line VSSL2 arranged in the nonactive area NA through a contact hole or the like.

Accordingly, the noise reduction electrode NRE can receive the same level of voltage as that applied to the second electrode E2 through the second base voltage line VSSL2.

This can prevent formation of a capacitance between the noise reduction electrode NRE and the second electrode E2, and the noise coupled with the second electrode E2 can be reduced by arrangement of the noise reduction electrode NRE.

According to the above-described example embodiments of the present disclosure, touch routing wires TL are arranged to have different widths in different areas such that the resistance deviation of the touch routing wires TL can be compensated for. In addition, compensation patterns CPTN are arranged to be connected to respective touch routing wires TL and to form different magnitudes of capacitances such that the capacitance deviation of the touch routing wires TL can be compensated for.

The same voltage as that applied to the second electrode E2 arranged beneath the encapsulation portion ENCAP is applied to the second compensation pattern CPTN2 that constitutes the compensation patterns CPTN such that there is a single noise source on the path of detection of touch sensing signals, thereby improving the performance of touch sensing in the differential sensing type.

In addition, a noise reduction electrode NRE is arranged between the second electrode E2 and the signal line in the active area AA of the display panel DISP such that the noise of the second electrode E2, which is coupled with signals applied to the signal line, can be reduced.

Accordingly, the noise of the touch electrode TE, which is coupled with noise of the second electrode E2, is reduced, thereby further improving the touch sensing performance.

Furthermore, the noise reduction electrode NRE is arranged on the layer on which the first electrode E1 is arranged in the area in which the first electrode E1 is not arranged such that the noise reduction electrode NRE can be easily arranged without adding a mask.

In addition, the same level of voltage as that applied to the second electrode E2 is applied to the noise reduction electrode NRE such that any load increase caused by the noise reduction electrode NRE is prevented, noise coupled with the second electrode E2 is reduced, and the noise of the touch electrode TE, which follows the noise of the second electrode E2, is reduced.

Although various example embodiments of the present disclosure has been described for illustrative purposes, those skilled in the art will appreciate that various modifications, additions and substitutions are possible, without departing from the scope and spirit of the disclosure as disclosed in the accompanying claims. Therefore, example embodiments of the present disclosure have been described for the sake of brevity and clarity. The scope of the present disclosure shall be construed on the basis of the accompanying claims in such a manner that all of the technical ideas included within the scope equivalent to the claims belong to the present disclosure.

What is claimed is:

1. A touch display device comprising:
    a substrate including an active area in which multiple subpixels are arranged and a non-active area positioned outside the active area;
    wherein each of the multiple subpixels includes a first electrode, an organic light emitting layer and a second electrode on the organic light emitting layer;
    an encapsulation layer arranged on the second electrode;
    a plurality of touch electrodes and a plurality of touch routing wires arranged on the encapsulation layer;
    a touch sensing circuit configured to drive the plurality of touch electrodes through the plurality of touch routing wires;
    multiple connection patterns arranged on the encapsulation layer in the active area so as to electrically connect at least a portion of the plurality of touch electrodes to each other;
    multiple first compensation patterns arranged in the non-active area and electrically connected to the plurality of touch routing wires; and
    multiple second compensation patterns arranged on the encapsulation layer corresponding to the multiple first compensation patterns.

2. The touch display device of claim 1, wherein a ground voltage is applied to the multiple second compensation patterns.

3. The touch display device of claim 1, wherein a same voltage is applied to the second electrode and the multiple second compensation patterns.

4. The touch display device of claim 1, wherein the multiple second compensation patterns are electrically connected to the second electrode via at least one hole provided in the encapsulation layer.

5. The touch display device of claim 1, wherein the multiple second compensation patterns are arranged on a same layer as the multiple connection patterns.

6. The touch display device of claim 1, further comprising:
    at least one touch insulating film between the multiple connection patterns and the plurality of touch electrodes.

7. The touch display device of claim 6, wherein the at least one touch insulating film comprises:
    a first touch insulating film between the multiple connection patterns and the multiple second compensation patterns; and
    a second touch insulating film between the multiple second compensation patterns and the multiple first compensation patterns.

8. The touch display device of claim 1, wherein an area of each of the multiple first compensation patterns, on each side of the substrate, is inversely proportional to a length of a corresponding one of the plurality of touch routing wires.

9. The touch display device of claim 1, wherein at least one of the plurality of touch routing wires has a first part arranged in a first area closer to the touch sensing circuit and a second part arranged in a second area further from the touch sensing circuit, a width of the first part being smaller than a width of the second part.

10. The touch display device of claim 1, wherein the touch sensing circuit is configured to detect a touch based on a signal corresponding to a difference between a first touch sensing signal received through a first touch routing wire and a second touch sensing signal received through a second touch routing wire from among the plurality of touch routing wires.

11. The touch display device of claim 1, wherein the plurality of touch routing wires are arranged along a sloped surface of the encapsulation layer and are connected to a touch pad portion.

12. The touch display device of claim 1, further comprising:
a dam arranged on the non-active area, wherein the plurality of touch routing wires cross over the dam.

13. The touch display device of claim 1, further comprising:
at least one noise reduction electrode arranged on same layer as the first electrode, wherein the at least one noise reduction electrode is spaced apart from the first electrode.

14. The touch display device of claim 13, wherein a same voltage is applied to the at least one noise reduction electrode and the second electrode.

15. The touch display device of claim 13, wherein the at least one noise reduction electrode extends from the active area to the non-active area in the same layer as the first electrode.

16. The touch display device of claim 15, wherein the at least one noise reduction electrode is electrically connected to the second electrode.

17. A touch display device comprising:
a substrate including an active area in which multiple subpixels are arranged and a non-active area, each of the multiple subpixels including a first electrode, an organic light emitting layer and a second electrode on the organic light emitting layer;
an encapsulation layer arranged on the second electrode;
a plurality of touch electrodes and a plurality of touch routing wires arranged on the encapsulation layer; and
multiple compensation patterns configured to equalize first capacitance and second capacitance, the first capacitance being formed between the plurality of touch electrodes and the second electrode in the active area, the second capacitance being formed between the plurality of touch routing wires and the second electrode in the non-active area.

18. The touch display device of claim 17, wherein a same voltage is applied to the second electrode and the multiple second compensation patterns to equalize the first capacitance and the second capacitance.

19. The touch display device of claim 17, further comprising:
at least one noise reduction electrode arranged on same layer as the first electrode, wherein the at least one noise reduction electrode is spaced apart from the first electrode and is configured to reduce noise associated with the second electrode in the active area.

20. The touch display device of claim 19, wherein a same voltage is applied to the at least one noise reduction electrode and the second electrode.

21. The touch display device of claim 19, wherein the at least one noise reduction electrode extends from the active area to the non-active area in the same layer as the first electrode.

22. The touch display device of claim 21, wherein the at least one noise reduction electrode is electrically connected to the second electrode.

23. The touch display device of claim 17, wherein an area of each of the multiple compensation patterns, on each side of the substrate, is inversely proportional to a length of a corresponding one of the plurality of touch routing wires.

24. The touch display device of claim 17, wherein the plurality of touch routing wires are arranged along a sloped surface of the encapsulation layer and are connected to a touch pad portion.

* * * * *